(12) United States Patent

Yoon

(10) Patent No.: US 12,672,537 B2

(45) Date of Patent: Jun. 30, 2026

(54) SEMICONDUCTOR DEVICES INCLUDING CONTACT PLUGS HAVING SILICIDE LAYERS AND METHODS FOR FABRICATING THE SAME

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 482 days.

(21) Appl. No.: 18/322,607

(22) Filed: May 24, 2023

(65) Prior Publication Data

US 2024/0145386 A1 May 2, 2024

(30) Foreign Application Priority Data

Oct. 31, 2022 (KR) ........................ 10-2022-0142563

(51) Int. Cl.
| | |
|---|---|
| *H01L 23/528* | (2006.01) |
| *H10B 12/00* | (2023.01) |
| *H10W 20/41* | (2026.01) |

(52) U.S. Cl.
CPC ........ *H10W 20/435* (2026.01); *H10B 12/315* (2023.02); *H10B 12/482* (2023.02)

(58) Field of Classification Search
CPC ........... H01L 23/5283; H01L 21/28518; H01L 21/76805; H01L 21/76843; H01L 21/76855; H01L 21/76897; H01L 23/485; H01L 23/53266; H01L 21/76877; H10B 12/315; H10B 12/482; H10B 12/033; H10B 12/48; H10B 12/485; H10B 12/03; H10B 12/09; H10D 84/0186; H10D 84/038; H10D 84/85

See application file for complete search history.

(56) References Cited

U.S. PATENT DOCUMENTS

| | | | |
|---|---|---|---|
| 2011/0294287 A1 | 12/2011 | Lin et al. | |
| 2014/0248761 A1* | 9/2014 | Park ..................... | H10D 84/038 |
| | | | 438/586 |
| 2021/0272811 A1* | 9/2021 | Ji .......................... | H01L 21/266 |

FOREIGN PATENT DOCUMENTS

| | | |
|---|---|---|
| KR | 10-2013-0131755 A | 12/2013 |
| KR | 10-2014-0108960 A | 9/2014 |
| KR | 10-2016-0097869 A | 8/2016 |

* cited by examiner

*Primary Examiner* — Karen Kusumakar

(74) *Attorney, Agent, or Firm* — IP & T GROUP LLP

(57) ABSTRACT

A semiconductor device includes an inter-layer dielectric layer over a substrate; a first contact plug structure coupled to a first active region of the substrate by vertically penetrating the inter-layer dielectric layer, and a second contact plug structure coupled to a second active region of the substrate. The first contact plug structure includes a first metal silicide layer; a first contact barrier layer over the first metal silicide layer; and a first contact plug over the first contact barrier layer. The second contact plug structure includes a second metal silicide layer; a second contact barrier layer over the second metal silicide layer; and a second contact plug over the second contact barrier layer. The first and second metal silicide layers include different metal silicides. The first metal silicide layer has a wider horizontal width and a greater vertical height than the second metal silicide layer.

20 Claims, 27 Drawing Sheets

SEMICONDUCTOR DEVICES INCLUDING CONTACT PLUGS HAVING SILICIDE LAYERS AND METHODS FOR FABRICATING THE SAME

CROSS-REFERENCE TO RELATED APPLICATIONS

The present application claims priority of Korean Patent Application No. 10-2022-0142563, filed on Oct. 31, 2022, which is incorporated herein by reference in its entirety.

BACKGROUND

1. Field

Embodiments of the present disclosure relate to semiconductor devices including contact plugs having silicide layers, and methods for fabricating the semiconductor devices.

2. Description of the Related Art

In the process of manufacturing semiconductor devices, undesirable resistance is typically produced between contact plugs and polycrystalline silicon layers. In order to reduce the contact resistance, techniques of forming a silicide layer between a polycrystalline silicon layer and a metal layer are described.

SUMMARY

Embodiments of the present disclosure are directed to providing a semiconductor device including a silicide layer of a p-type metal-oxide-semiconductor (PMOS) region and a silicide layer of an n-type metal-oxide-semiconductor (NMOS) region that include different metal silicides.

Embodiments of the present disclosure are directed to providing a method for fabricating a semiconductor device including a silicide layer of a PMOS region and a silicide layer of an NMOS region that include different metal silicides.

Embodiments of the present disclosure are directed to providing a semiconductor device that includes a contact plug of a PMOS region including a first metal silicide, a contact plug of an NMOS region including a second metal silicide, and a cell contact plug.

Embodiments of the present disclosure are directed to providing a method for fabricating a semiconductor device that includes a contact plug of a PMOS region including a first metal silicide, a contact plug of an NMOS region including a second metal silicide, and a cell contact plug.

In accordance with an embodiment of the present disclosure, a semiconductor device includes: an inter-layer dielectric layer over a substrate; and a first contact plug structure, which is coupled to a first active region of the substrate by vertically penetrating the inter-layer dielectric layer, and a second contact plug structure, which is coupled to a second active region of the substrate. The first contact plug structure includes: a first metal silicide layer; a first contact barrier layer over the first metal silicide layer; and a first contact plug over the first contact barrier layer. The second contact plug structure includes: a second metal silicide layer; a second contact barrier layer over the second metal silicide layer; and a second contact plug over the second contact barrier layer, wherein the first metal silicide layer and the second metal silicide layer include different metal silicides, and the first metal silicide layer has a wider horizontal width and a greater vertical height than the second metal silicide layer.

In accordance with another embodiment of the present disclosure, a semiconductor device includes: a first contact plug structure formed in a first region of a substrate; a second contact plug structure formed in a second area of the substrate; and a third contact plug structure formed in a third region of the substrate. The first contact plug structure includes a first metal silicide layer, a first contact barrier layer, and a first contact plug. The second contact plug structure includes a second metal silicide layer, a second contact barrier layer, and a second contact plug. The third contact plug structure includes a lower contact plug, a third metal silicide layer, and a third contact plug, and the first metal silicide layer and the second metal silicide layer include different metals, and the second metal silicide layer and the third metal silicide layer include the same metal.

In accordance with another embodiment of the present disclosure, a semiconductor device includes: a first contact plug structure disposed over a first region of a substrate, the first contact plug structure including a first metal silicide layer, a first contact barrier layer, and a first contact plug, which are sequentially stacked; a second contact plug structure disposed over a second region of the substrate, the second contact plug structure including a second metal silicide layer, a second contact barrier layer, and a second contact plug, which are sequentially stacked; and a third contact plug structure disposed over a third region of the substrate. The third contact plug structure includes a lower contact plug, a third metal silicide layer, and a third contact plug. The first metal silicide layer and the second metal silicide layer include different metals. The second metal silicide layer and the third metal silicide layer include the same metal.

In accordance with another embodiment of the present disclosure, a method for fabricating a semiconductor device includes: forming an inter-layer dielectric layer over a substrate; forming a first hole and a second hole which penetrate the inter-layer dielectric layer in a direction perpendicular to the inter-layer dielectric layer to expose the substrate; forming a sacrificial buffer dielectric layer in the second hole; forming a first metal layer in a lower end portion of the first hole; forming a first metal silicide layer in the lower end portion of the first hole by performing a first silicidation process within a first temperature range; forming a second metal layer in a lower end portion of the second hole; forming a second metal silicide layer in the lower end portion of the second hole by performing a second silicidation process within a second temperature range; forming a first contact barrier layer over the first metal silicide layer in the first hole; and forming a second contact barrier layer over the second metal silicide layer in the second hole, wherein the first temperature range is higher than the second temperature range.

BRIEF DESCRIPTION OF THE DRAWINGS

FIGS. 3A and 3B are longitudinal cross-sectional views schematically illustrating semiconductor devices in accordance with embodiments of the present disclosure.

FIGS. 5A to 5K, FIG. 6, FIGS. 7A to 7C, and FIG. 8 illustrate methods for fabricating semiconductor devices in accordance with embodiments of the present disclosure.

DETAILED DESCRIPTION

Figure 1:
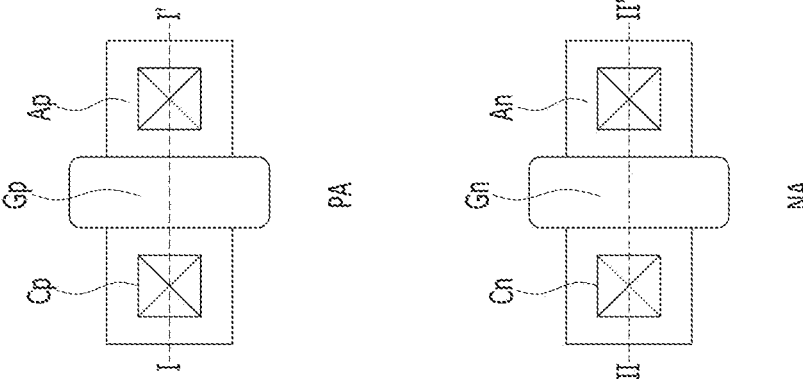
FIG. 1 is a layout of a semiconductor device in accordance with an embodiment of the present disclosure.

Various embodiments of the present disclosure will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the diverse figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a layout of a semiconductor device in accordance with an embodiment of the present disclosure. Referring to FIG. 1, a semiconductor device in accordance with the embodiment of the present disclosure may include a first transistor area PA, a second transistor area NA, and a cell area CA. For example, the first transistor area PA may be a PMOS transistor area, and the second transistor area NA may be an NMOS transistor area. The semiconductor device may include a first active region Ap, a first gate electrode Gp, and a first contact plug Cp that are positioned in the first transistor area PA, and may include a second active region An, a second gate electrode Gn, and a second contact plug Cn that are positioned in the second transistor area NA. The first active region Ap, the first gate electrode Gp, and the first contact plug Cp may form a PMOS transistor, and the second active region An, the second gate electrode Gn, and the second contact plug Cn may form an NMOS transistor.

The semiconductor device may include cell gate lines GL, cell bit lines BL, and cell active regions Ac that are positioned in the cell area CA. The cell gate lines GL may extend parallel to each other in a first direction D1. The cell bit lines BL may extend parallel to each other in a second direction D2. The cell active regions Ac may have a shape of segments extending in a third direction D3. The first direction D1 and the second direction D2 may be perpendicular to each other. Accordingly, the cell gate lines GL and the cell bit lines BL may perpendicularly intersect each other. The third direction D3 may be inclined with respect to the first direction D1 and the second direction D2. Accordingly, the third direction D3 may diagonally cross the direction that the cell active regions Ac are stretched, that is, the third direction D3 may diagonally cross the cell gate lines GL and the cell bit lines BL.

Figure 2A:
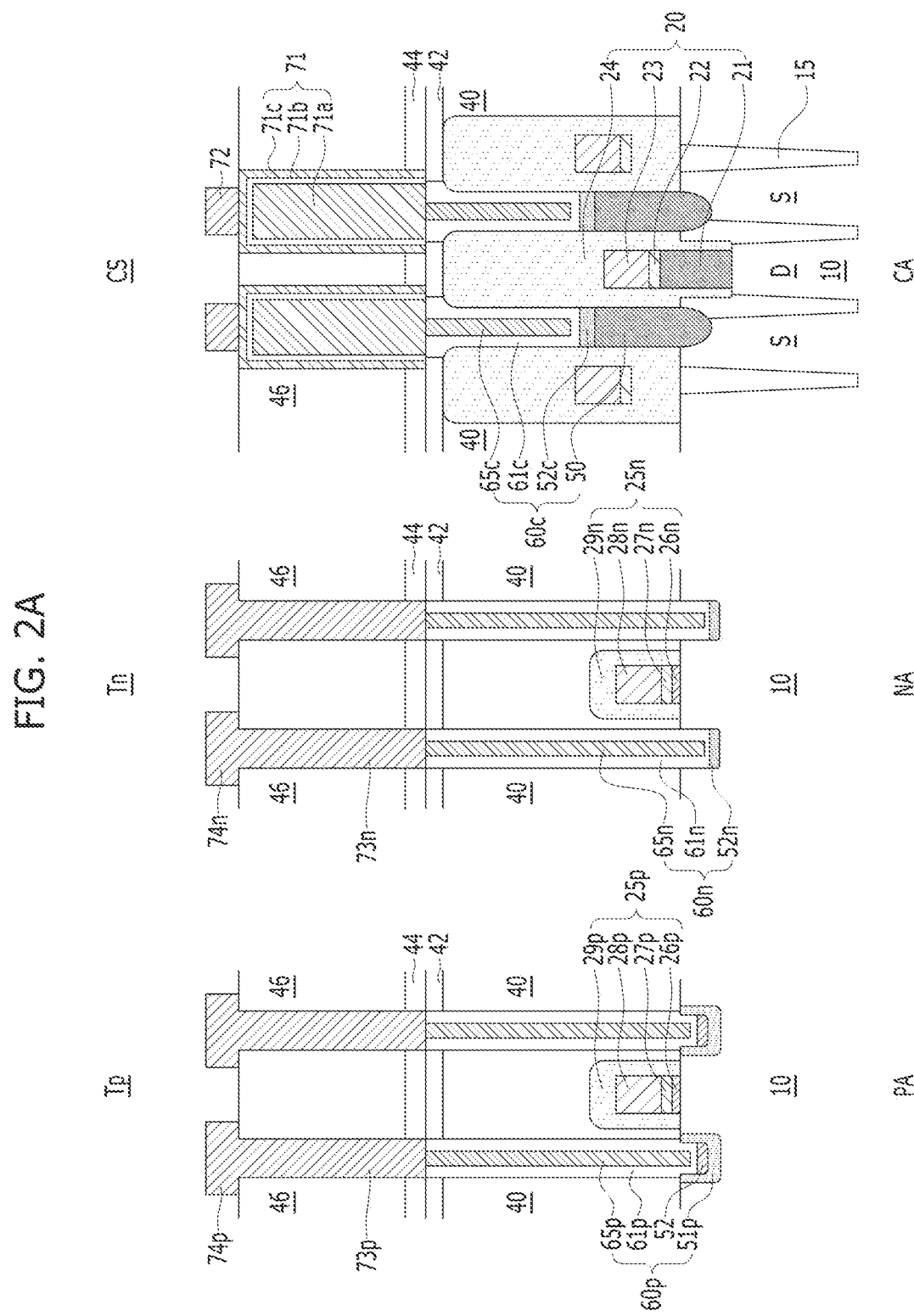
FIGS. 2A to 2D are longitudinal cross-sectional views illustrating semiconductor devices in accordance with embodiments of the present disclosure.

FIGS. 2A to 2D are longitudinal cross-sectional views illustrating semiconductor devices in accordance with embodiments of the present disclosure. For example, these are cross-sectional views of the semiconductor devices taken along lines I-I', II-II', and III-III' shown in FIG. 1. Referring to FIG. 2A, a semiconductor device in accordance with an embodiment of the present disclosure may include a first transistor structure Tp which is formed over a first transistor area PA of a substrate 10, a second transistor structure Tn which is formed over a second transistor area NA of the substrate 10, and a cell structure CS which is formed over a cell area CA of the substrate 10.

The substrate 10 of the first transistor area PA may include N-type impurities. For example, the substrate 10 of the first transistor area PA may include a silicon wafer that is doped with phosphorus (P) or arsenic (As), or an epitaxially grown layer that includes phosphorus (P) or arsenic (As). Further referring to FIG. 1, the first active region Ap of the first transistor area PA may include P-type impurities. The substrate 10 of the second transistor area NA and the cell area CA may include P-type impurities. For example, the substrate 10 of the second transistor area NA and the cell area CA may include a silicon wafer that is doped with boron (B) or an epitaxially grown layer that includes boron (B). Further referring to FIG. 1, the second active region An of the second transistor area NA may include N-type impurities.

The first transistor structure Tp may be a PMOS transistor. The first transistor structure Tp may have a first gate structure 25*p* and a 20) first contact plug structure 60*p* which is positioned adjacent to the first gate structure 25*p*. The first transistor structure Tp may further include a first metal via plug 73*p* and a first metal wire 74*p*. The first gate structure 25*p* may include a first gate dielectric layer 26*p*, a first gate barrier layer 27*p*, a first gate electrode layer 28*p*, and a first gate capping layer 29*p*. The first gate dielectric layer 26*p* may be directly formed on the substrate 10. The first gate dielectric layer 26*p* may include a metal oxide, such as silicon oxide ($SiO_2$) or hafnium oxide (HfO). The first gate barrier layer 27*p* may include a barrier metal layer, such as a titanium nitride (TiN) layer. The first gate electrode layer 28*p* may include at least one of the following: a metal, a metal alloy, and a metal compound. The first gate capping layer 29*p* may cover the side surfaces of the first gate dielectric layer 26*p*, the first gate barrier layer 27*p*, the first gate electrode layer 28*p*, and the top surface of the first gate electrode layer 28*p*. The first gate capping layer 29*p* may include silicon oxide ($SiO_2$), silicon nitride (SiN), or a combination thereof. According to another embodiment of the present disclosure, the first gate structure 25*p* may further include a first gate silicide layer which is interposed between the first gate dielectric layer 26*p* and the first gate barrier layer 27*p*. The first gate silicide layer may include a metal-silicon compound, such as titanium silicide (TiSi).

The first contact plug structure 60*p* may include a first metal silicide layer 51*p*, a second metal layer 52, a first contact barrier layer 61*p*, and a first contact plug 65*p* that are formed thereunder. The first 20) metal silicide layer 51*p* may have a U-shaped cross section that surrounds the bottom and side surfaces of the lower end portion of the second metal layer 52, the first contact barrier layer 61*p*, and the first contact plug 65*p*. For example, the first metal silicide layer 51*p* may have a bowl shape. The first metal silicide layer 51*p* may include one among cobalt silicide (CoSi), molybdenum silicide (MoSi), and titanium carbon silicide (TiCSi). The second metal layer 52 may be surrounded by the first metal silicide layer 51*p*. For example, the second metal layer 52 may have a shape contained in the bowl-shaped first metal silicide layer 51*p*. The second metal layer 52 may include either titanium (Ti) or niobium (Nb). The first contact barrier layer 61*p* may have a cylindrical shape that surrounds the side surfaces and the lower end portion of the first contact plug 65*p*. The lower portion of the first contact barrier layer 61$p$ may contact the second metal layer 52. The lower side surfaces of the first contact barrier layer 61$p$ may contact the first metal silicide layer 51$p$. The first contact barrier layer 61$p$ may include a barrier metal layer, such as a titanium nitride (TiN) layer. The first contact plug 65$p$ may have a pillar shape which is surrounded by the first contact barrier layer 61$p$. The first contact plug 65$p$ may include a metal, such as tungsten (W). The first metal via plug 73$p$ may be vertically aligned over the first contact plug structure 60$p$. The first metal via plug 73$p$ may include a liner layer, a barrier layer, and a plug metal. The liner layer may include silicon oxide ($SiO_2$) or silicon nitride (SiN) that surrounds the outer surface of the first metal via plug 73$p$. The barrier layer may be formed to surround the plug metal in the liner layer. The barrier layer may include a barrier metal layer, such as a titanium nitride (TiN) layer. The plug metal may include a metal, such as tungsten (W). The first metal wire 74$p$ may be aligned over the first metal via plug 73$p$. The first metal wire 74$p$ may include a barrier layer and a wire metal. According to another embodiment of the present disclosure, the first metal via plug 73$p$ may be omitted.

The second transistor structure Tn may be an NMOS transistor. The second transistor structure Tn may include a second gate structure 25$n$ and a second contact plug structure 60$n$ which is positioned adjacent to the second gate structure 25$n$. The second transistor structure Tn may further include a second metal via plug 73$n$ and a second metal wire 74$n$. The second gate structure 25$n$ may include a second gate dielectric layer 26$n$, a second gate barrier layer 27$n$, a second gate electrode layer 28$n$, and a second gate capping layer 29$n$. The second gate dielectric layer 26$n$ may be directly formed over the substrate 10. The second gate dielectric layer 26$n$ may include a metal oxide, such as silicon oxide ($SiO_2$) or hafnium oxide (HfO). The second gate barrier layer 27$n$ may include a barrier metal layer, such as a titanium nitride (TiN) layer. The second gate electrode layer 28$n$ may include at least one among a metal, a metal alloy, and a metal compound. The second gate capping layer 29$n$ may cover the side surfaces of the second gate dielectric layer 26$n$, the second gate barrier layer 27$n$, and the second gate electrode layer 28$n$, and the top surface of the second gate electrode layer 28$n$. The second gate capping layer 29$n$ may include silicon oxide ($SiO_2$), silicon nitride (SiN), or a combination thereof. According to another embodiment of the present disclosure, the second transistor structure Tn may further include a second gate silicide layer which is interposed between the second gate dielectric layer 26$n$ and the second gate barrier layer 27$n$. The second gate silicide layer may include a metal-silicon compound, such as titanium silicide (TiSi).

The second contact plug structure 60$n$ may include a second metal silicide layer 52$n$, a second contact barrier layer 61$n$, and a second contact plug 65$n$ that are formed thereunder. The second metal silicide layer 52$n$ may have a pad shape contacting the bottom surface of the lower end portion of the second contact barrier layer 61$n$. For example, the second metal silicide layer 52$n$ may not cover the side surfaces of the lower end portions of the second contact barrier layer 61$n$ and the second contact plug 65$n$. The second metal silicide layer 52$n$ may have a wider horizontal width, a greater (higher) vertical height, and a greater (thicker) thickness than the second metal silicide layer 52$n$.

According to another embodiment of the present disclosure, the second contact barrier layer 61$n$ may have a U-shaped cross section that surrounds the side surfaces and the lower end portions of the second contact plug 65$n$. The second metal silicide layer 52$n$ may include either titanium silicide (TiSi) or niobium silicide (NbSi). The second contact barrier layer 61$n$ may have a cylindrical shape that surrounds the side surfaces and a lower portion of the second contact plug 65$n$. A lower end of the second contact barrier layer 61$n$ may contact the second metal silicide layer 52$n$. The lower side surfaces of the second contact barrier layer 61$n$ may contact the substrate 10. The second contact barrier layer 61$n$ may include a barrier metal layer, such as a titanium nitride (TiN) layer. The second contact plug 65$n$ may have a pillar shape that is surrounded by the second contact barrier layer 61$n$. The second contact plug 65$n$ may include a metal, such as tungsten (W). The second metal via plug 73$n$ may be vertically aligned over the second contact plug structure 60$n$. The second metal via plug 73$n$ may include a liner layer, a barrier layer, and a plug metal. The liner layer may include silicon oxide ($SiO_2$) or silicon nitride (SiN) that surrounds the outer surface of the second metal via plug 73$n$. The barrier layer may be formed to surround the plug metal within the liner layer. The barrier layer may include a barrier metal layer, such as a titanium nitride (TiN) layer. The plug metal may include a metal, such as tungsten (W). The second metal wire 74$n$ may be formed to be aligned over the second metal via plug 73$n$. The second metal wire 74$n$ may include a barrier layer and a wire metal. According to another embodiment of the present disclosure, the second metal via plug 73$n$ may be omitted.

The cell structure CS may include an isolation region 15 which is formed in the substrate 10, a bit line structure 20 which is formed over the substrate 10, and a cell contact plug structure 60$c$. The bit line structure 20 and the cell contact plug structure 60$c$ may be positioned adjacent to each other. The cell structure CS may further include a capacitor structure 71 and a cell metal wire 72. The isolation region 15 may include a trench which is formed in the substrate 10 to define source regions S and a drain region D, and a dielectric material filling the trench. The source regions S and the drain region D may form the cell active region Ac shown in FIG. 1.

The bit line structure 20 may include a bit line contact plug 21, a bit line barrier layer 22, a bit line electrode layer 23, and a bit line capping layer 24. The bit line contact plug 21 may have a pillar shape that is coupled to the drain region D of the substrate 10. The bit line contact plug 21 may protrude into the substrate 10. The bit line contact plug 21 may include N-doped silicon. For example, the bit line contact plug 21 may include deposited N-doped polysilicon or epitaxially grown N-doped silicon. The bit line barrier layer 22 may have a pad shape that is formed over the bit line contact plug 21. The bit line barrier layer 22 may include a barrier metal layer, such as a titanium nitride (TiN) layer. According to another embodiment of the present disclosure, the bit line structure 20 may further include a bit line silicide layer that is formed between the bit line contact plug 21 and the bit line barrier layer 22. The bit line silicide layer may include a metal silicide, such as titanium silicide (TiSi). The bit line electrode layer 23 may include a metal, such as tungsten (W). The bit line capping layer 24 may cover the side surfaces of the bit line contact plug 21, the bit line barrier layer 22, the bit line electrode layer 23, and the top surface of the bit line electrode layer 23. The bit line capping layer 24 may include silicon oxide ($SiO_2$), silicon nitride (SiN), or a combination thereof. The cell contact plug structure 60$c$ may be formed between the bit line structures 20. The cell contact plug structure 60$c$ may include a lower cell contact plug 50, a cell contact silicide layer 52$c$, a cell contact barrier layer 61$c$, and an upper cell contact plug 65$c$. The lower cell contact plug 50 may be coupled to the source regions S of the substrate 10. The lower end of the lower cell contact plug 50 may protrude into the substrate 10. The lower cell contact plug 50 may include N-doped silicon. For example, the lower cell contact plug 50 may include deposited N-doped polysilicon or epitaxially grown N-doped silicon. The cell contact silicide layer 52c may be formed in a pad shape over the lower cell contact plug 50. The cell contact silicide layer 52c may include the same material as that of the second metal silicide layer 52n. For example, the cell contact silicide layer 52c may include either titanium silicide (TiSi) or niobium silicide (NbSi). The cell contact barrier layer 61c may have a cylindrical shape that surrounds the side surfaces and a bottom of the upper cell contact plug 65c. The cell contact barrier layer 61c may include a barrier metal layer, such as a titanium nitride (TiN) layer. The upper cell contact plug 65c may have a pillar shape. The upper cell contact plug 65c may include a metal, such as tungsten (W). The capacitor structure 71 may include a lower capacitor electrode 71a, a capacitor dielectric layer 71b, and an upper capacitor electrode 71c. The lower capacitor electrode 71a may be vertically aligned with and electrically connected to the cell contact plug structure 60c. The lower capacitor electrode 71a may have a pillar or cylindrical shape. The lower capacitor electrode 71a may include a metal, such as tungsten (W), a metal compound, such as titanium nitride (TiN), or a metal alloy. The capacitor dielectric layer 71b may be conformally formed on the surface of the lower capacitor electrode 71a. The capacitor dielectric layer 71b may include a metal oxide, such as hafnium oxide (HfO), zirconium oxide (ZrO), and tantalum oxide (TaO), or other high-k materials. The upper capacitor electrode 71c may cover the surface of the capacitor dielectric layer 71b. The upper capacitor electrode 71c may include a metal. The cell metal wire 72 may be aligned over the upper capacitor electrode 71c to be coupled to the upper capacitor electrode 71c. The cell metal wire 72 may include a barrier layer and a wire metal.

The semiconductor device may further include a lower inter-layer dielectric layer 40, a stopping layer 42, a capping dielectric layer 44, and an upper inter-layer dielectric layer 46. The lower inter-layer dielectric layer 40 may cover the first gate structure 25p and surround the first contact plug structure 60p in the first transistor area PA. The lower inter-layer dielectric layer 40 may include a dielectric material, such as silicon oxide (SiO$_2$). The stopping layer 42 may be formed over the lower inter-layer dielectric layer 40. The stopping layer 42 may include a dielectric material having an etch selectivity with respect to the lower inter-layer dielectric layer 40. For example, the stopping layer 42 may include one of the following: silicon nitride (SiN), silicon boron nitride (SiBN), silicon boron carbon nitride (SiBCN), or any combination thereof. The first contact plug structure 60p, the second contact plug structure 60n, and the cell contact plug structure 60c may penetrate the lower inter-layer dielectric layer 40 and the stopping layer 42 in a direction perpendicular to the lower inter-layer dielectric layer 40 and the stopping layer 42. The capping dielectric layer 44 may be formed planar over the stopping layer 42. The capping dielectric layer 44 may include one of the following: silicon nitride (SiN), silicon boron nitride (SiBN), silicon boron carbon nitride (SiBCN), or any combination thereof. According to another embodiment of the present disclosure, either the stopping layer 42 or the capping dielectric layer 44 may be omitted. The upper inter-layer dielectric layer 46 may be formed over the stopping layer 42 and the capping dielectric layer 44. The first metal via plug 73p, the second metal via plug 73n, and the capacitor structure 71 may vertically penetrate the capping dielectric layer 44 or the upper inter-layer dielectric layer 46. The upper inter-layer dielectric layer 46 may include a dielectric material, such as silicon oxide (SiO$_2$).

The first gate barrier layer 27p of the first gate structure 25p, the second gate barrier layer 27n of the second gate structure 25n, and the bit line barrier layer 22 of the bit line structure 20 may be formed simultaneously and may include the same material. The first gate electrode layer 28p of the first gate structure 25p, the second gate electrode layer 28n of the second gate structure 25n, and the bit line electrode layer 23 of the bit line structure 20 may be formed simultaneously and may include the same material. The first gate silicide layer of the first gate structure 25p, the second gate silicide layer of the second gate structure 25n, and the bit line silicide layer of the bit line structure 20 may be formed simultaneously and include the same material.

The first metal silicide layer 51p of the first contact plug structure 60p and the second metal silicide layer 52n of the second contact plug structure 60n may include different silicides. For example, the first metal silicide layer 51p may include one of the following: cobalt silicide (CoSi), molybdenum silicide (MoSi), and titanium carbon silicide (TiCSi). The second metal silicide layer 52n may include either titanium silicide (TiSi) or niobium silicide (NbSi). The first metal silicide layer 51p may include one among the silicides that are formed at relatively high temperatures. The second metal silicide layer 52p may include one among the silicides that are formed at relatively low temperatures. The cell contact silicide layer 52c of the cell contact plug structure 60c may be formed simultaneously with the second metal silicide layer 52n of the second contact plug structure 60n and may include the same silicide. The second metal layer 52 of the first contact plug structure 60p, the second metal silicide layer 52n of the second contact plug structure 60n, and the cell contact silicide layer 52c of the cell contact plug structure 60c may contain the same metal. For example, as mentioned above, the second metal layer 52, the second metal silicide layer 52n, and the cell contact silicide layer 52c may include one of the following: cobalt (Co), molybdenum (Mo), and titanium carbon (TIC) in common.

Figure 2B:
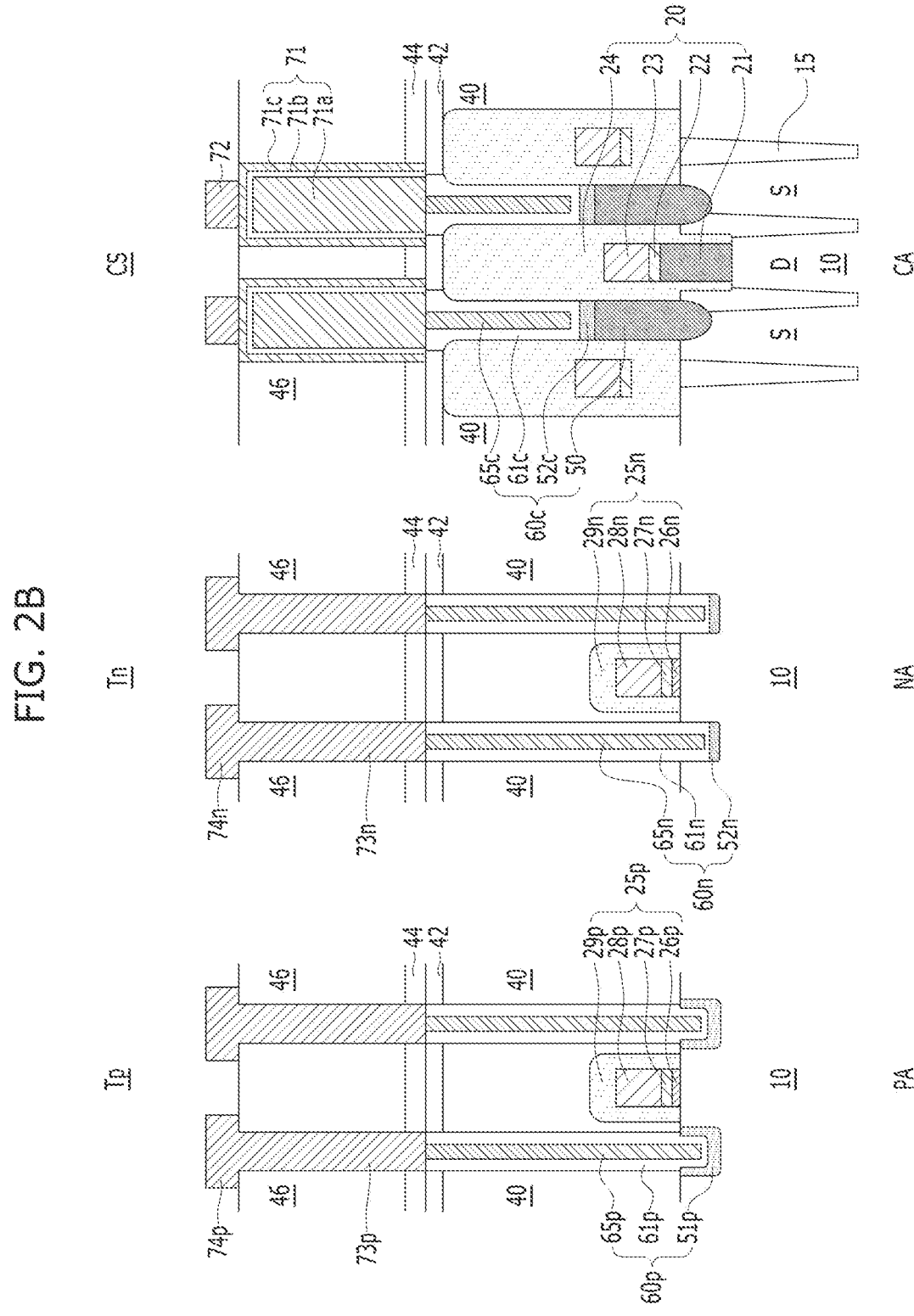

Referring to FIG. 2B, a semiconductor device in accordance with an embodiment of the present disclosure may include a first transistor structure Tp which is formed over a first transistor area PA of a substrate 10, a second transistor structure Tn which is formed over a second transistor area NA of the substrate 10, and a cell structure CS which is formed over the cell area CA of the substrate 10. Compared to what is shown in FIG. 2A, the first contact plug structure 60p may not include the second metal layer 52. That is, the bottom surface of the first contact barrier layer 61p may directly contact the first metal silicide layer 51p. The constituent elements that are not described herein will be understood by referring to FIG. 2A.

Figure 2C:
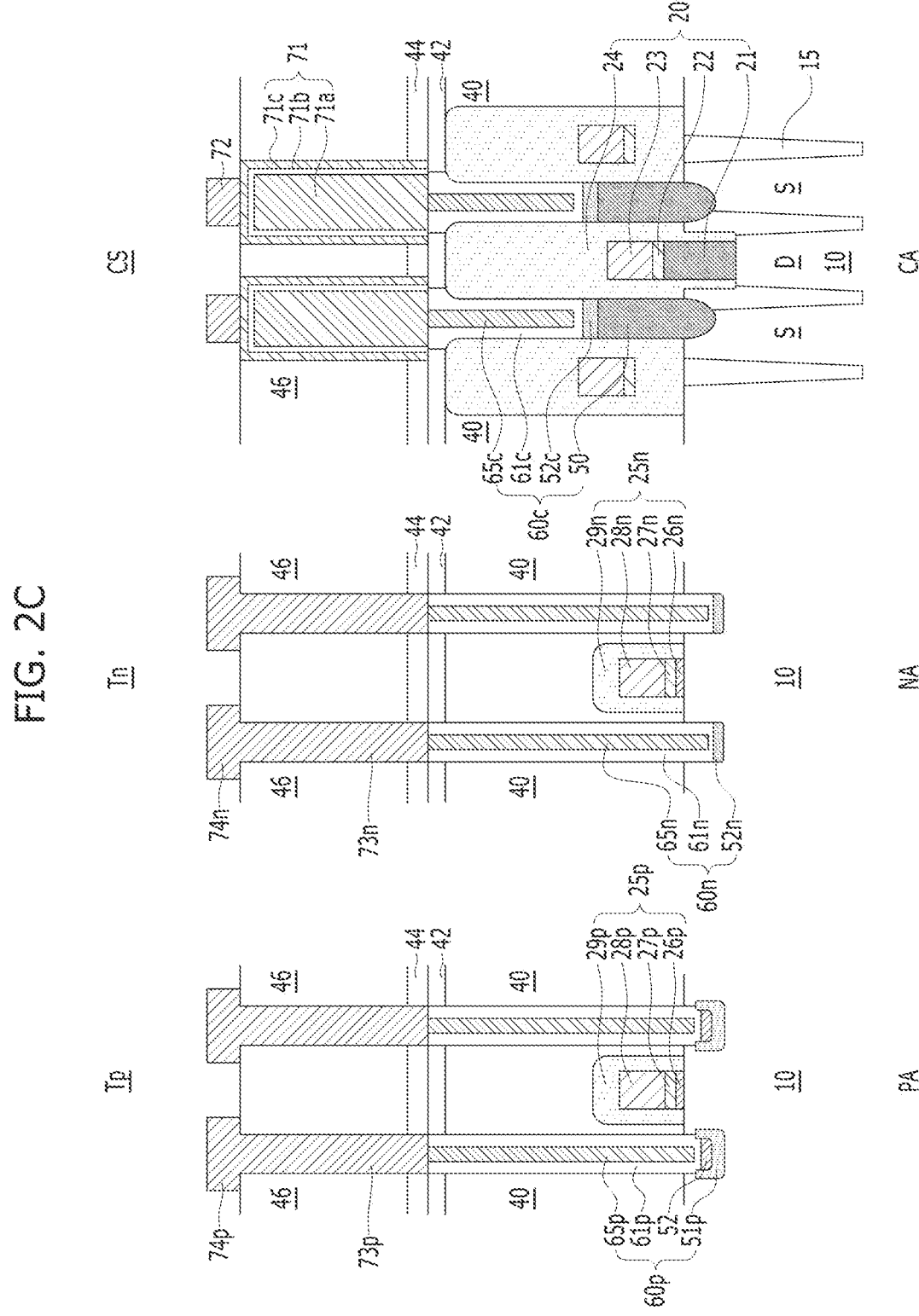

Referring to FIG. 2C, a semiconductor device in accordance with an embodiment of the present disclosure may include a first transistor structure Tp, which is formed over a first transistor area PA of a substrate 10, a second transistor structure Tn, which is formed over a second transistor area NA of the substrate 10, and a cell structure CS, which is formed over a cell area CA of the substrate 10. Compared to what is illustrated in FIG. 2A, the size (e.g., vertical height, horizontal width, thickness, volume, etc.) of the first metal silicide layer 51p of the first contact plug structure 60p may be reduced. Accordingly, the sidewalls of the lower end portion of the first contact barrier layer 61p may contact the substrate 10. The constituent elements that are not described herein will be understood by referring to FIG. 2A.

Figure 2D:
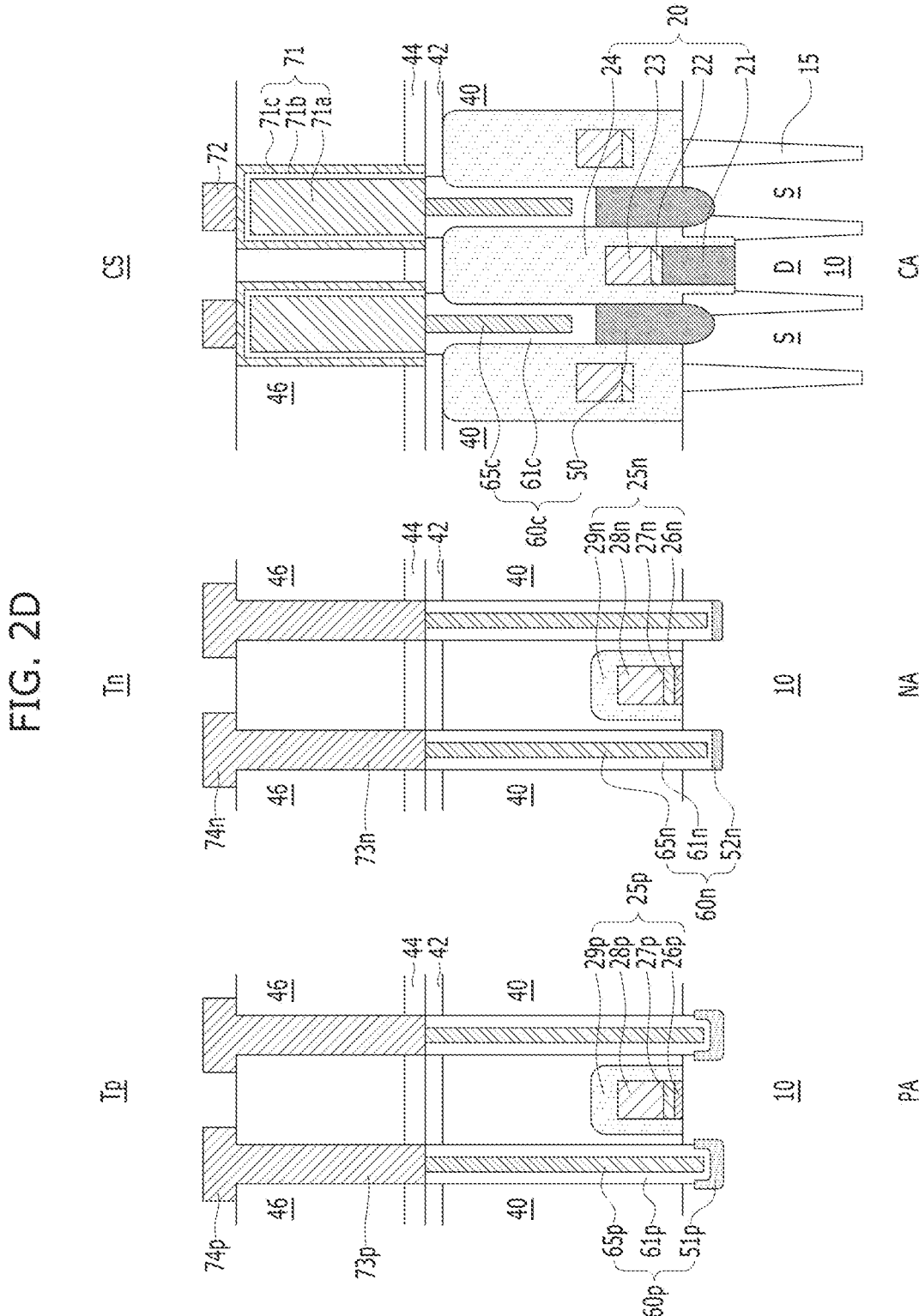

Referring to FIG. 2D, a semiconductor device in accordance with an embodiment of the present disclosure may include a first transistor structure Tp which is formed over a first transistor area PA of a substrate 10, a second transistor structure Tn which is formed over a second transistor area NA of the substrate 10, and a cell structure CS which is formed over a cell area CA of the substrate 10. Compared to what is illustrated in FIGS. 2A and 2B, the size of the first metal silicide layer 51p of the first contact plug structure 60p may be reduced as shown in FIG. 2C. Compared to what is illustrated in FIGS. 2A and 2C, the first contact plug structure 60p may not include the metal layer 52 as shown in FIG. 2B. The constituent elements that are not described herein will be understood by referring to FIG. 2A.

Figure 3A:
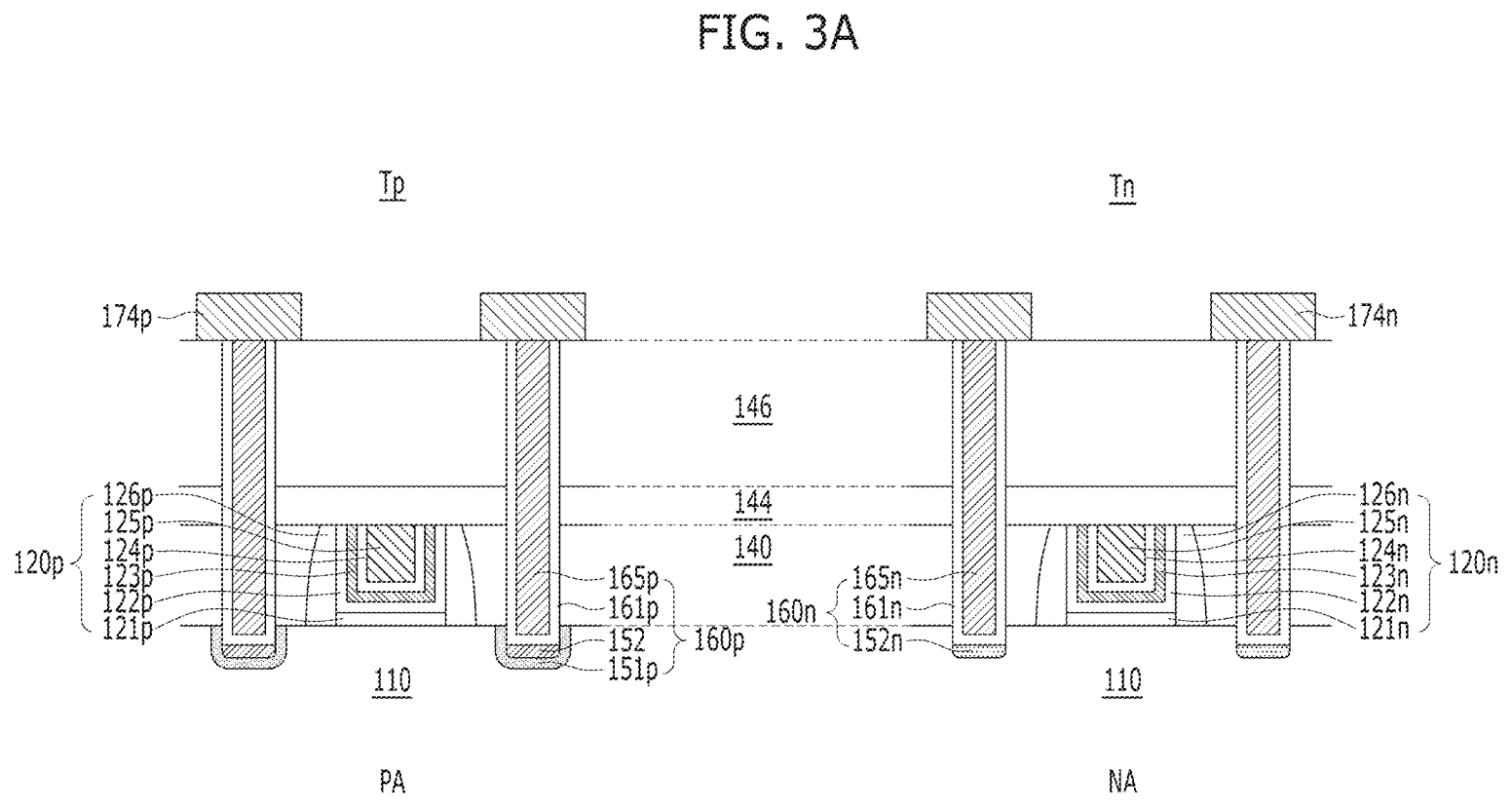
Figure 3B:
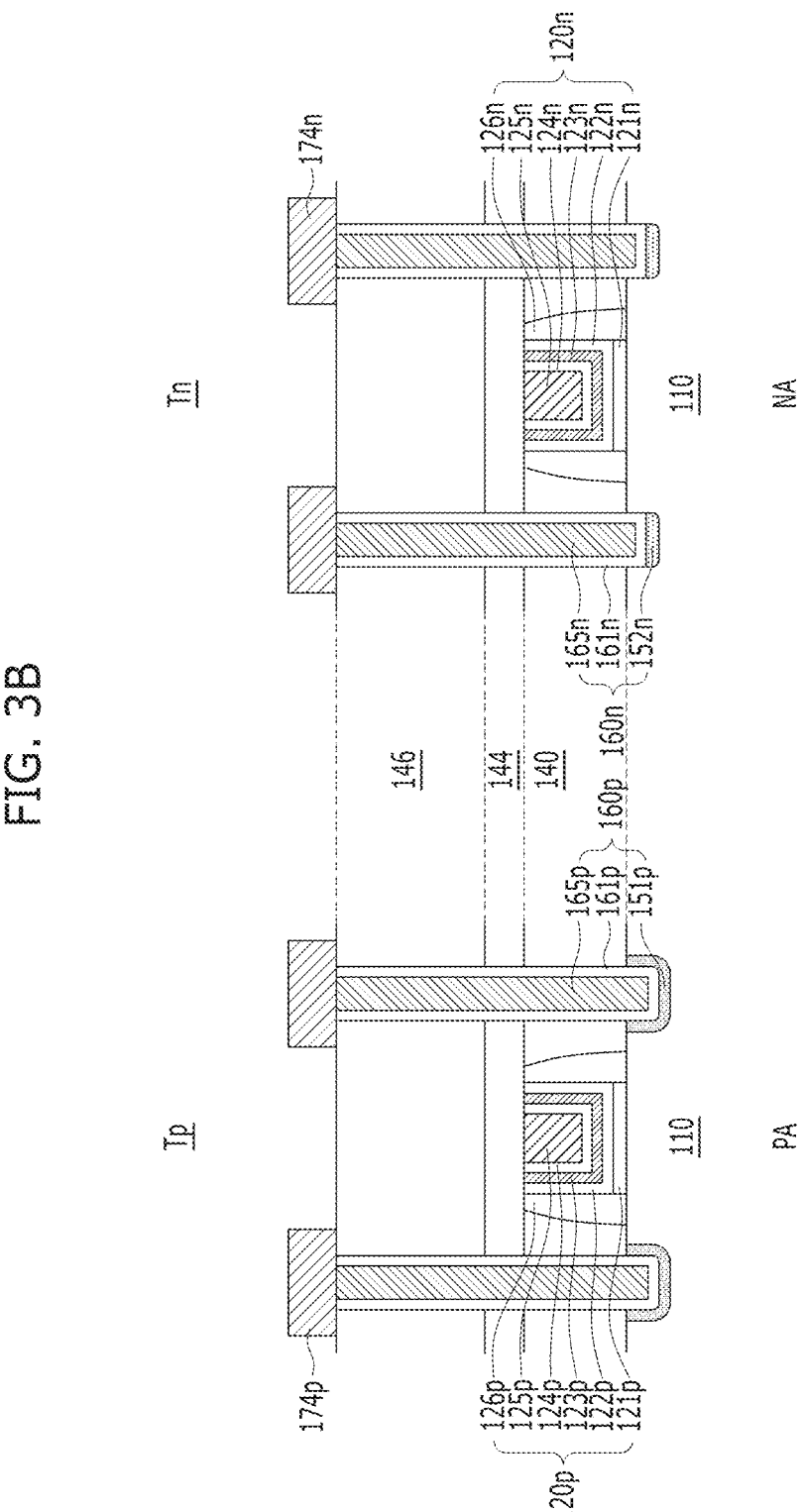

FIGS. 3A and 3B are longitudinal cross-sectional views schematically illustrating semiconductor devices in accordance with embodiments of the present disclosure. For example, these are longitudinal cross-sectional views taken along lines II-II' and III-III' shown in FIG. 1. Referring to FIG. 3A, a semiconductor device in accordance with an embodiment of the present disclosure may include a first transistor structure Tp which is formed over the substrate 110 of the first transistor area PA, and a second transistor structure In which is formed over the substrate 110 of the second transistor area NA. The semiconductor device may further include a lower inter-layer dielectric layer 140, a stopping layer 144, and an upper inter-layer dielectric layer 146. The semiconductor device may further include a first metal wire 174p and a second metal wire 174n. The substrate 110 of the first transistor area PA may include N-type impurities. The substrate 110 of the second transistor area NA may include P-type impurities. For example, the first transistor structure Tp may be a PMOS transistor, and the second transistor structure Tn may be an NMOS transistor.

The first transistor structure Tp may have a first gate structure 120p and a first contact plug structure 160p. The first gate structure 120p may include a first gate interface dielectric layer 121p, a first gate dielectric layer 122p, a first gate barrier layer 123p, a first gate work function control layer 124p, a first gate electrode layer 125p, and a first gate spacer 126p. The first gate interface dielectric layer 121p may be directly formed over the substrate 110. The first gate interface dielectric layer 121p may have a pad shape. The first gate interface dielectric layer 121p may include silicon oxide ($SiO_2$). The first gate dielectric layer 122p may be formed over the first gate interface dielectric layer 121p. The first gate dielectric layer 122p may include a metal oxide, such as hafnium oxide (HfO). The first gate dielectric layer 122p may have a U-shaped cross section that surrounds the bottom and side surfaces of the first gate barrier layer 123p. The first gate barrier layer 123p may include a barrier metal layer, such as a titanium nitride (TiN) layer. The first gate barrier layer 123p may cover the bottom and side surfaces of the first gate work function control layer 124p in a U-shape. The first gate work function control layer 124p may include a combination of diverse metal compound layers and/or metal alloy layers. The first gate work function control layer 124p may cover the bottom and side surfaces of the first gate electrode layer 125p in a U-shape.

According to another embodiment of the present disclosure, the first gate work function control layer 124p may be omitted. The first gate spacer 126p may be formed on the sidewalls of the first gate dielectric layer 122p. The first gate spacer 126p may contact a side end portion of the first gate interface dielectric layer 121p. The top portions of the first gate dielectric layer 122p, the first gate barrier layer 123p, the first gate work function control layer 124p, the first gate electrode layer 125p, and the first gate spacer 126p may be co-planar.

The first contact plug structure 160p may include a first metal silicide layer 151p, a second metal layer 152, a first contact barrier layer 161p, and a first contact plug 165p that are formed thereunder. The first metal silicide layer 151p may have a U-shaped cross section that surrounds the lower end portions of the second metal layer 152, the first contact barrier layer 161p, and the first contact plug 165p. For example, the first metal silicide layer 151p may have a bowl shape. The first metal silicide layer 151p may include one of the following: cobalt silicide (CoSi), molybdenum silicide (MoSi), and titanium carbon silicide (TiCSi). The second metal layer 152 may be surrounded by the first metal silicide layer 151p. For example, the second metal layer 152 may have a shape contained within the bowl-shaped first metal silicide layer 151p. The second metal layer 152 may include either titanium (Ti) or niobium (Nb). The first contact barrier layer 161p may have a cylindrical shape that surrounds the side surfaces and a lower end portion of the first contact plug 165p. The lower end of the first contact barrier layer 161p may contact the second metal layer 152. The lower side surfaces of the first contact barrier layer 161p may contact the first metal silicide layer 151p. The first contact barrier layer 161p may include a barrier metal layer, such as a titanium nitride (TiN) layer. The first contact plug 165p may have a pillar shape. The first contact plug 165p may include a metal, such as tungsten (W). The first metal wire 174p may include a barrier layer and a wire metal.

The second transistor structure Tn may include a second gate structure 120n and a second contact plug structure 160n. The second gate structure 120n may include a second gate interface dielectric layer 121n, a second gate dielectric layer 122n, a second gate barrier layer 123n, a second gate work function control layer 124n, a second gate electrode layer 125n, and a second gate spacer 126n. The second gate interface dielectric layer 121n may be directly formed over the substrate 110. The second gate interface dielectric layer 121n may have a pad shape. The second gate interface dielectric layer 121n may include silicon oxide ($SiO_2$). The second gate dielectric layer 122n May be formed over the second gate interface dielectric layer 121n. The second gate dielectric layer 122n may include a metal oxide, such as hafnium oxide (HfO). The second gate dielectric layer 122n may have a U-shaped cross section that surrounds the bottom and side surfaces of the second gate barrier layer 123n. The second gate barrier layer 123n may include a barrier metal layer, such as a titanium nitride (TiN) layer. The second gate barrier layer 123n may cover the bottom and side surfaces of the second gate work function control layer 124n in a U-shape. The second gate work function control layer 124n May include a combination of various metal compound layers and/or metal alloy layers. The second gate work function control layer 124n may cover the bottom and side surfaces of the second gate electrode layer 125n in a U-shape. The second gate work function control layer 124n may be omitted. The second gate spacer 126n may be formed on the sidewalls of the second gate dielectric layer 122n. The second gate spacer 126n may contact a side end of the second gate interface dielectric layer 121n. The top portions of the second gate dielectric layer 122n, the second gate barrier layer 123n, the second gate work function control layer 124n, the second gate electrode layer 125n, and the second gate spacer 126n may be co-planar.

The second contact plug structure 160*n* may include a second metal silicide layer 152*n*, a second contact barrier layer 161*n*, and a second contact plug 165*n* that are formed thereunder. The second metal silicide layer 152*n* may have a pad shape contacting the lower end portion of the first contact barrier layer 161*p*. The second metal silicide layer 152*n* may include either titanium silicide (TiSi) or niobium silicide (NbSi). The second contact barrier layer 161*n* may have a cylindrical shape that surrounds the side surfaces and a lower end portion of the second contact plug 165*n*. The side surfaces of the lower end portion of the second contact barrier layer 161*n* may contact the substrate 110.

The lower inter-layer dielectric layer 140 may cover the side surfaces of the first gate structure 120*p* and the second gate structure 120*n*. The lower inter-layer dielectric layer 140 may include silicon oxide ($SiO_2$). The top surfaces of the lower inter-layer dielectric layer 140, the first gate structure 120*p*, and the second gate structure 120*n* may be planar. The stopping layer 144 may be formed planar over the lower inter-layer dielectric layer 140. The stopping layer 144 may include one among silicon nitride (SiN), silicon boron nitride (SiBN), silicon boron carbon nitride (SiBCN), and a combination thereof to have an etch selectivity with respect to the lower inter-layer dielectric layer 140. The upper inter-layer dielectric layer 146 may be formed over the stopping layer 144 to surround the upper portions of the side surfaces of the first contact plug structure 160*p* and the second contact plug structure 160*n*. The upper inter-layer dielectric layer 146 may include silicon oxide ($SiO_2$) to have an etch selectivity with respect the stopping layer 144. The first contact plug structure 160*p* and the second contact plug structure 160*n* may vertically penetrate the upper inter-layer dielectric layer 146, the stopping layer 144, and the lower inter-layer dielectric layer 140. The first metal wire 174*p* may be formed to be aligned over the first contact plug structure 160*p*, and the second metal wire 174*n* may be formed to be aligned over the second contact plug structure 160*n*.

The first metal silicide layer 151*p* of the first contact plug structure 160*p* and the second metal silicide layer 152*n* of the second contact plug structure 160*n* may include different silicides. For example, as mentioned earlier, the first metal silicide layer 151*p* may include one among cobalt silicide (CoSi), molybdenum silicide (MoSi), and titanium carbon silicide (TiCSi), and the second metal silicide layer 152*n* may include either titanium silicide (TiSi) or niobium silicide (NbSi). The first metal silicide layer 151*p* may include one among the silicides that are formed at relatively high temperatures, and the second metal silicide layer 152*n* may include one among the silicides that are formed at relatively low temperatures. The second metal layer 152 of the first contact plug structure 160*p* and the second metal silicide layer 152*n* of the second contact plug structure 160*n* may contain the same metal. For example, as mentioned earlier, the second metal layer 152 and the second metal silicide layer 152*n* may contain one among cobalt (Co), molybdenum (Mo), and titanium carbon (TiC) in common.

Referring to FIG. 3B, a semiconductor device in accordance with an embodiment of the present disclosure may include a first transistor structure Tp which is formed over a substrate 110 of a first transistor area PA, and a second transistor structure Tn which is formed over the substrate 110 of a second transistor area NA. The first transistor structure Tp may have a first gate structure 120*p* and a first contact plug structure 160*p*. The first contact plug structure 160*p* may include a first metal silicide layer 151*p*, a first contact barrier layer 161*p*, and a first contact plug 165*p* that are formed thereunder. The bottom surfaces of the lower ends of the first metal silicide layer 151*p* and the first contact barrier layer 161*p* may directly contact each other. According to another embodiment of the present disclosure, further referring back to FIGS. 2C and 2D, the side surfaces of the lower end portion of the first contact barrier layer 161*p* may contact the substrate 110. The constituent elements that are not described herein will be understood by referring to other drawings.

Figure 4A:
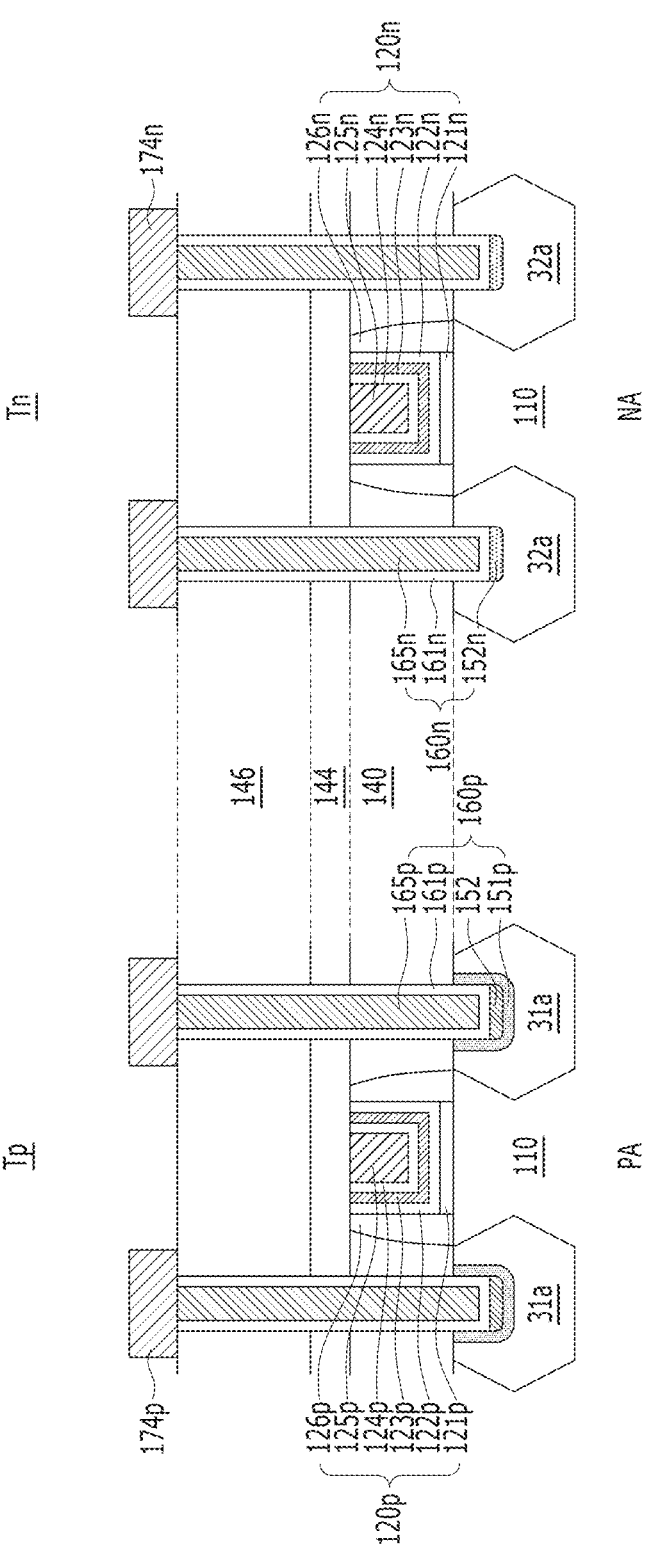
FIGS. 4A to 4D are longitudinal cross-sectional views illustrating semiconductor devices in accordance with embodiments of the present disclosure.
Figure 4B:
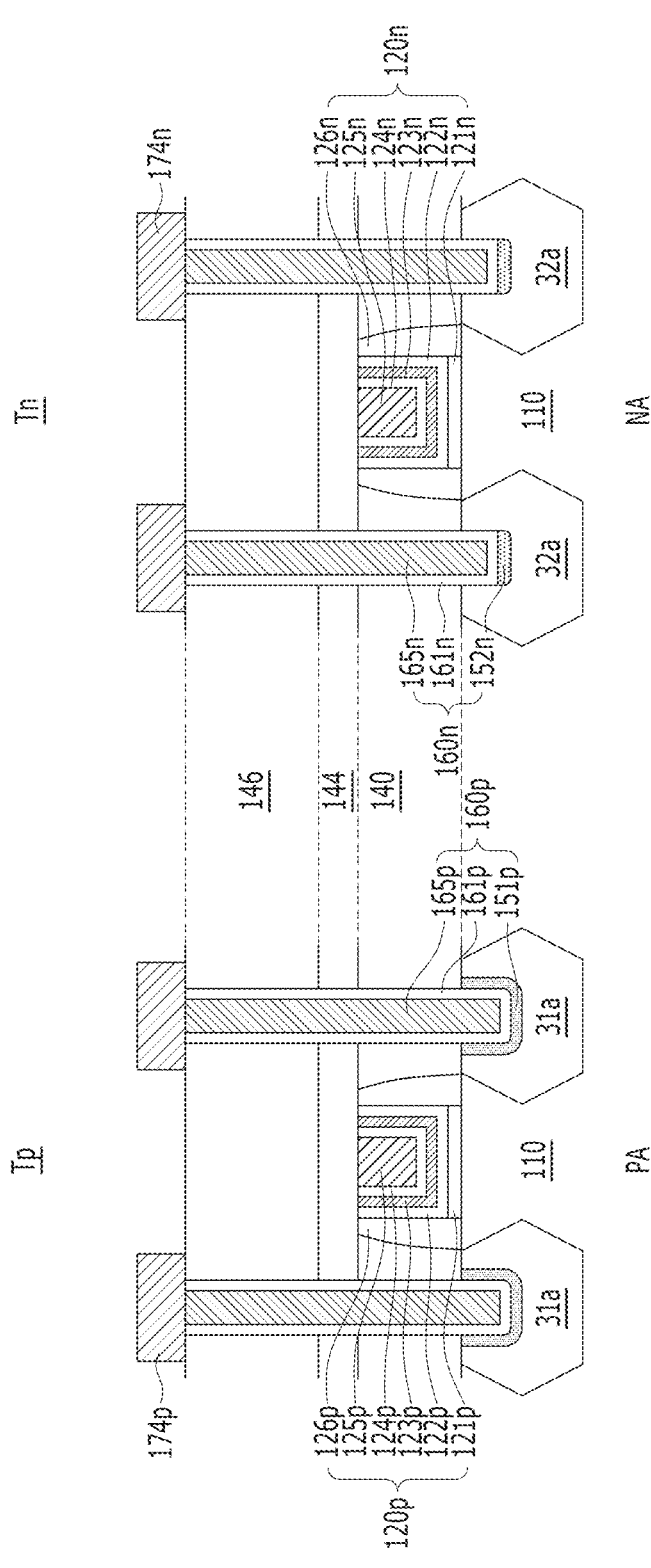

FIGS. 4A to 4D are longitudinal cross-sectional views illustrating semiconductor devices in accordance with embodiments of the present disclosure. For example, these are longitudinal cross-sectional views taken along lines II-II' and III-III' in FIG. 1. Referring to FIGS. 4A and 4B, a semiconductor device in accordance with an embodiment of the present disclosure may include an embedded first source/drain region 31*a* and an embedded second source/drain region 32*a* that are epitaxially grown in a substrate 110. The lower end portion of the first contact plug structure 160*p* may be formed in the embedded first source/drain region 31*a*, and the lower end portion of the second contact plug structure 160*n* may be formed in the embedded second source/drain region 32*a*. According to an embodiment of the present disclosure, the embedded first source/drain region 31*a* may include SiGe:B. For example, the embedded first source/drain region 31*a* may include an epitaxially grown silicon germanium layer which is doped with boron (B) in-situ. According to an embodiment of the present disclosure, the embedded second source/drain region 31*b* may include Si:P. For example, the embedded second source/drain region 31*b* may include an epitaxially grown silicon layer which is doped with phosphorous (P) in-situ.

Referring to FIG. 4A, the first contact plug structure 160*p* may include a first metal silicide layer 151*p*, a second metal layer 152, a first contact barrier layer 161*p*, and a first contact plug 165*p*. Referring to FIG. 4B, the first contact plug structure 160*p* may include a first metal silicide layer 151*p*, a first contact barrier layer 161*p*, and a first contact plug 165*p*. The first contact plug structure 160*p* may be understood more specifically by further referring to the other drawings.

Figure 4C:
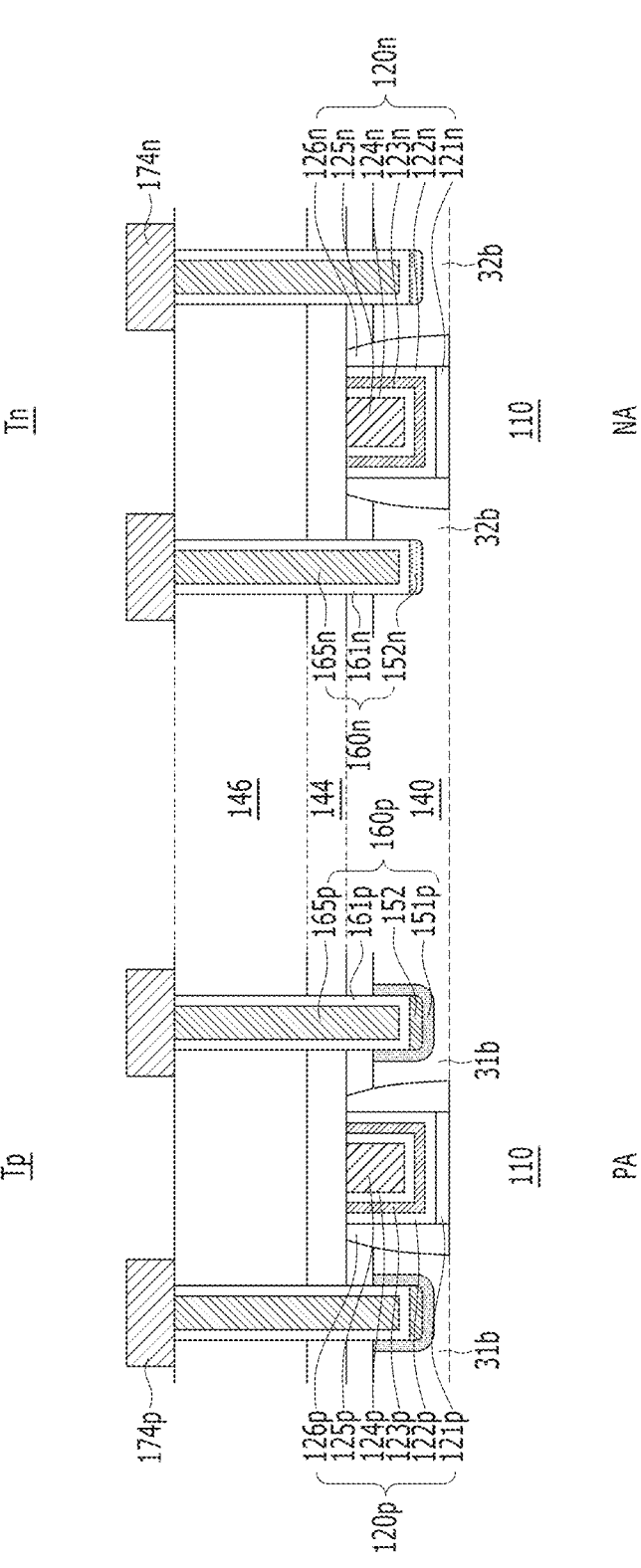
Figure 4D:
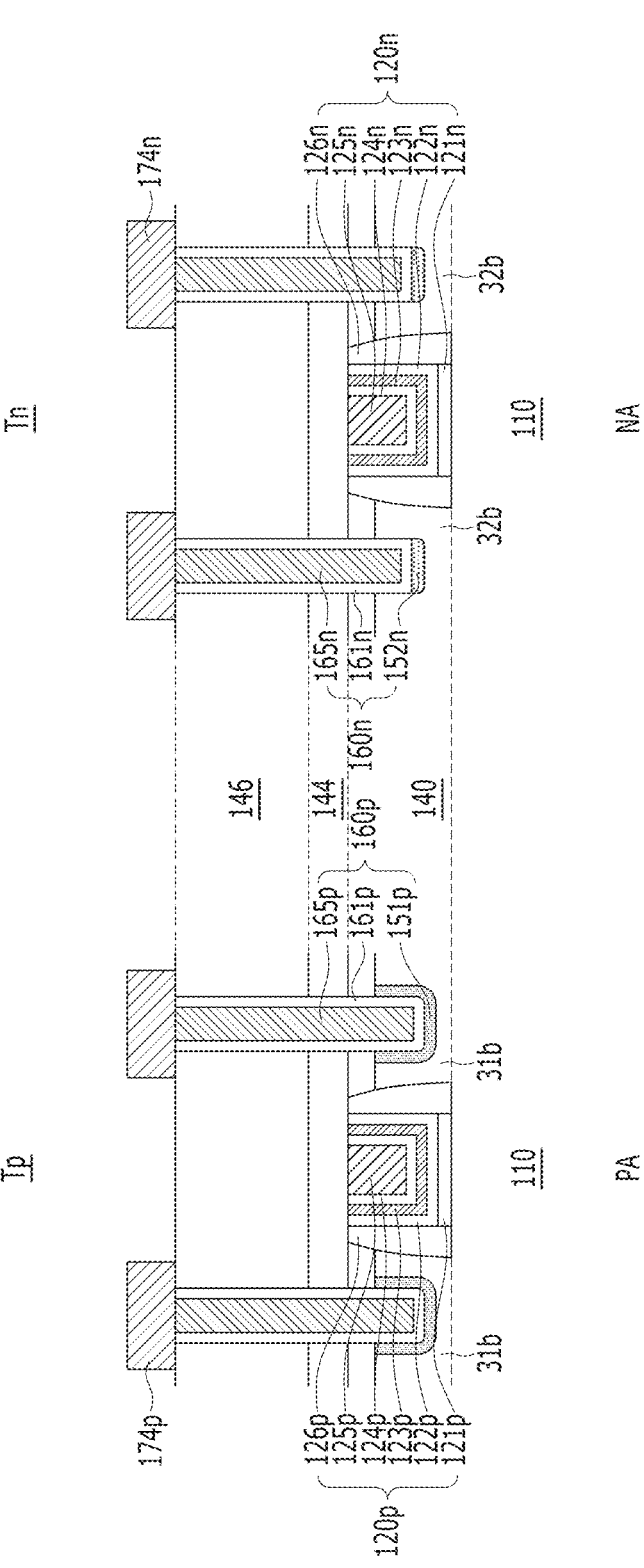

Referring to FIGS. 4C and 4D, a semiconductor device in accordance with an embodiment of the present disclosure may include an elevated first source/drain region 31*b* and an elevated second source/drain region 32*b* that are epitaxially grown over a substrate 110. The lower end portion of the first contact plug structure 160*p* may be formed in the elevated first source/drain region 31*b*, and the lower end portion of the second contact plug structure 160*n* may be formed in the elevated second source/drain region 32*b*.

According to the embodiment of the present disclosure, the elevated first source/drain region 31*b* may include SiGe:B. For example, the elevated first source/drain region 31*b* may include an epitaxially grown silicon germanium layer which is doped with boron (B) in-situ. According to the embodiment of the present disclosure, the elevated second source/drain region 32*b* may include Si:P. For example, the elevated second source/drain region 32*b* may include an epitaxially grown silicon layer which is doped with phosphorous (P) in-situ.

Referring to FIG. 4C, the first contact plug structure 160*p* may include a first metal silicide layer 151*p*, a second metal layer 152, a first contact barrier layer 161*p*, and a first contact plug 165*p*. Referring to FIG. 4D, the first contact plug structure 160*p* may include a first metal silicide layer 151*p*, a first contact barrier layer 161*p*, and a first contact plug 165p. The first contact plug structure 160p may be understood more specifically by further referring to the other drawings.

Figure 5A:
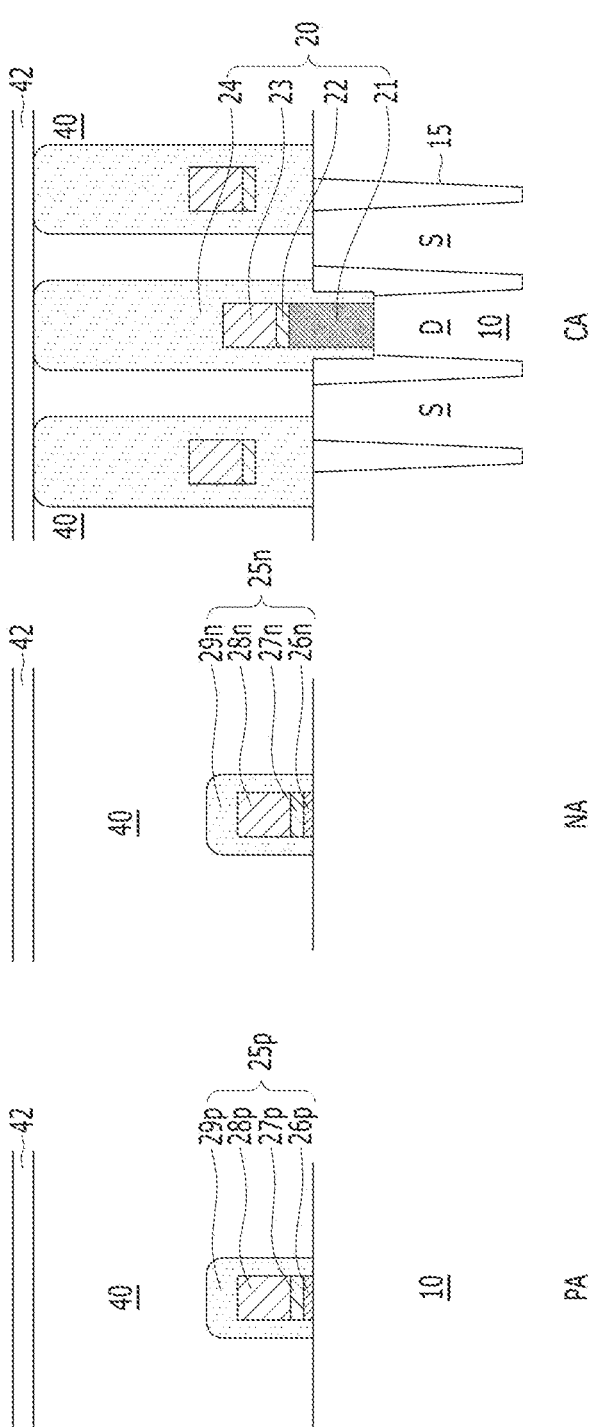

FIGS. 5A to 5K are longitudinal cross-sectional views taken along lines I-I', II-II', and III-III' shown in FIG. 1 to describe a method for fabricating a semiconductor device in accordance with an embodiment of the present disclosure. Referring to FIG. 5A, a method for fabricating a semiconductor device in accordance with an embodiment of the present disclosure may include forming isolation regions 15 and bit line structures 20 in a cell area CA of a substrate 10, forming a first gate structure 25p in a first transistor area PA of the substrate 10, and forming a second gate structure 25n in a second transistor area NA of the substrate 10. The isolation regions 15 may define a source region S and a drain region D. Forming the isolation regions 15 may include forming trenches in the substrate 10 and filling the trenches with a dielectric material. The source region S and the drain region D may be formed by doping the substrate 10 with ions, such as phosphorus (P) or arsenic (As). The source region S and the drain region D may form the cell active region Ac shown in FIG. 1. Forming the bit line structure 20 may include forming a bit line contact plug 21, a bit line barrier layer 22, a bit line electrode layer 23, and a bit line capping layer 24. Forming the bit line contact plug 21 may include forming N-doped polysilicon to contact the drain region D. Forming the bit line barrier layer 22 may include forming a barrier metal layer, such as a titanium nitride (TiN) layer. Forming the bit line electrode layer 23 may include forming a metal layer, such as tungsten (W). Forming the bit line capping layer 24 may include forming a dielectric layer, such as silicon nitride (SiN).

According to one embodiment of the present disclosure, the method may further include forming a bit line silicide layer between the bit line contact plug 21 and the bit line barrier layer 22. Forming the bit line silicide layer may include forming titanium silicide (TiSi), tungsten silicide (WSi), nickel silicide (NiSi), cobalt silicide (CoSi), or other metal-silicon compounds. Forming the first gate structure 25p may include forming a first gate dielectric layer 26p, a first gate barrier layer 27p, a first gate electrode layer 28p, and a first gate capping layer 29p. Forming the second gate structure 25n may include forming a second gate dielectric layer 26n, a second gate barrier layer 27n, a second gate electrode layer 28n, and a second gate capping layer 29n. Forming the first gate dielectric layer 26p and the second gate dielectric layer 26n may include forming a metal oxide layer, such as a silicon oxide ($SiO_2$) layer, a silicon nitride (SiN) layer, or a hafnium oxide ($HfO_2$) layer over the substrate 10. Forming the first gate barrier layer 27p and the second gate barrier layer 27n may include forming a barrier metal layer, such as a titanium nitride (TiN) layer. Forming the first gate electrode layer 28p and the second gate electrode layer 28n may include forming a metal layer, such as tungsten (W). The method may further include forming a lower inter-layer dielectric layer 40 that covers the bit line structure 20, the first gate structure 25p, and the second gate structure 25n, and a stopping layer 42 over the lower inter-layer dielectric layer 40. Forming the lower inter-layer dielectric layer 40 may include forming a silicon oxide ($SiO_2$) layer by performing a deposition process, and forming the stopping layer 42 may include forming a dielectric material layer whose silicon nitride (SiN) is harder than the lower inter-layer dielectric layer 40.

Figure 5B:
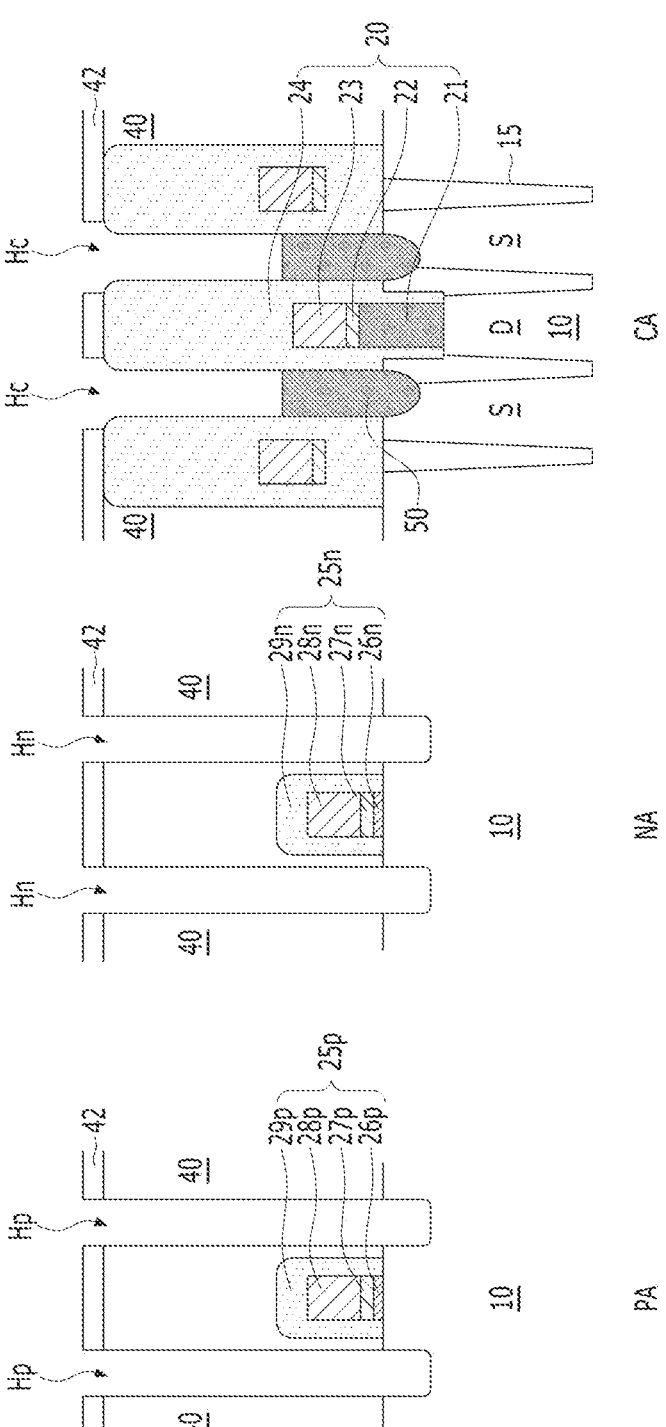

Referring to FIG. 5B, the method may further include forming a first hole Hp, a second hole Hn, and a cell hole Hc that vertically penetrate the stopping layer 42 and the lower inter-layer dielectric layer 40 to expose the substrate 10, and forming a lower cell contact plug 50 in the cell hole Hc. The first hole Hp, the second hole Hn, and the cell hole Hc may be formed individually or simultaneously. For example, the method may include the following operations: forming the cell hole Hc by performing a photolithography process of covering the first transistor area PA and the second transistor area NA and opening the cell area CA and performing an etching process; forming the lower cell contact plug 50 in the cell hole Hc by performing a deposition process and an etching process; and forming the first hole Hp and the second hole Hn by performing a photolithography process of covering the cell area CA and opening the first transistor area PA and the second transistor area NA and performing an etching process. The bottom portions of the first hole Hp, the second hole Hn, and the cell hole Hc may be recessed into the substrate 10. The bottom portions of the first hole Hp, the second hole Hn, and the cell hole Hc may be recessed to be lower than the surface of the substrate 10 so that the substrate 10 is exposed on the sidewalls of the bottom portions of the first hole Hp, the second hole Hn, and the cell hole Hc. The lower cell contact plug 50 may be formed through a deposition process or an epitaxial growth process. The lower cell contact plug 50 may include N-doped silicon (Si) or N-doped silicon germanium (SiGe).

Figure 5C:
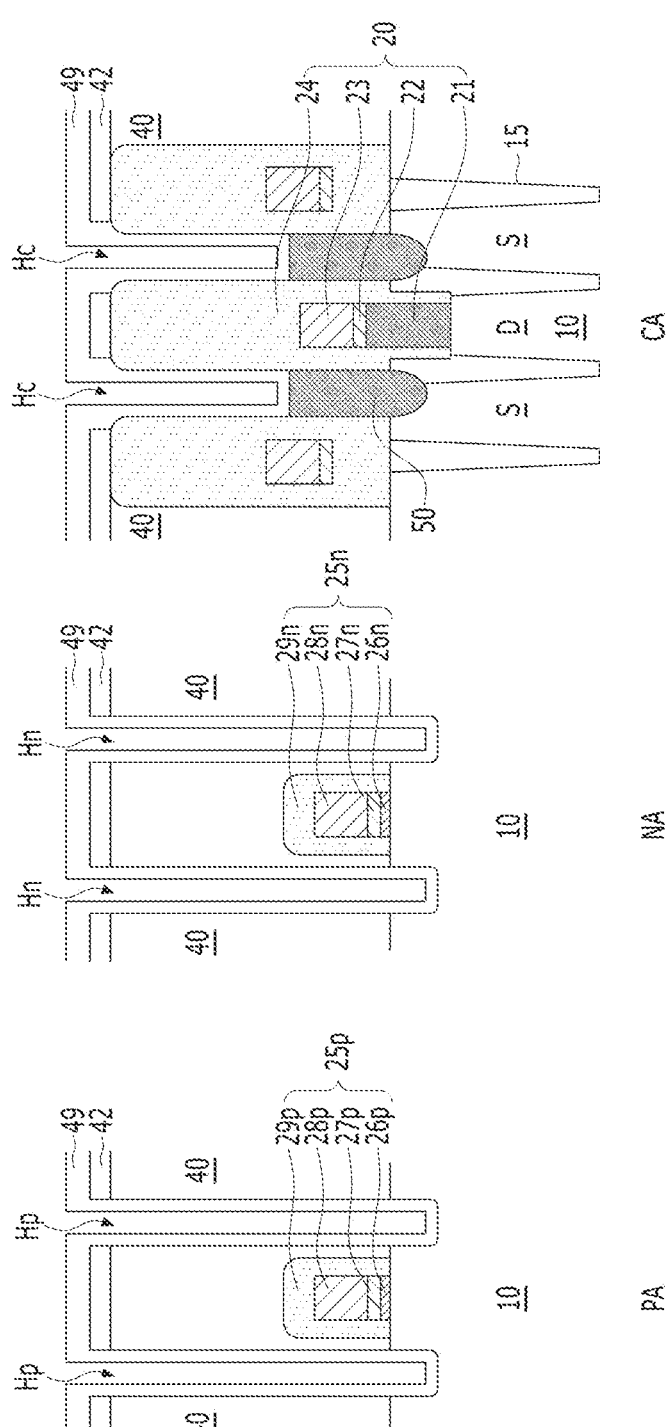

Referring to FIG. 5C, the method may further include forming a sacrificial buffer dielectric layer 49 conformally in the holes Hp, Hn and Hc. Forming the sacrificial buffer dielectric layer 49 may include performing a chemical vapor deposition (CVD) process, such as an atomic layered deposition (ALD) process. The sacrificial buffer dielectric layer 49 may include a dielectric material, such as silicon oxide ($SiO_2$).

Figure 5D:
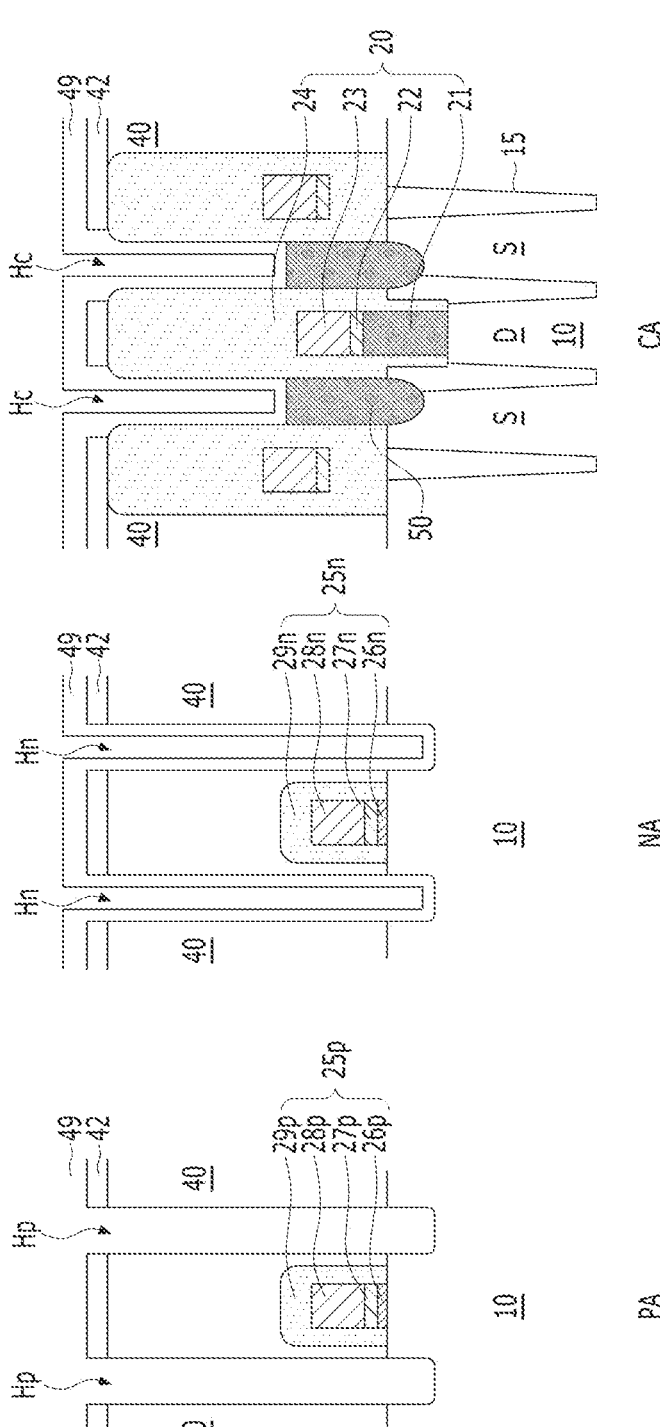

Referring to FIG. 5D, the method may further include removing the sacrificial buffer dielectric layer 49 from the first hole Hp in the first transistor area PA. The sacrificial buffer dielectric layer 49 in the second hole Hn in the second transistor area NA and the cell hole Hc in the cell area CA may remain in place. The substrate 10 may be exposed in bottom portions of the first hole Hp in the first transistor area PA, since the sacrificial buffer dielectric layer 49 is removed from the first hole Hp in the first transistor area PA.

Figure 5E:
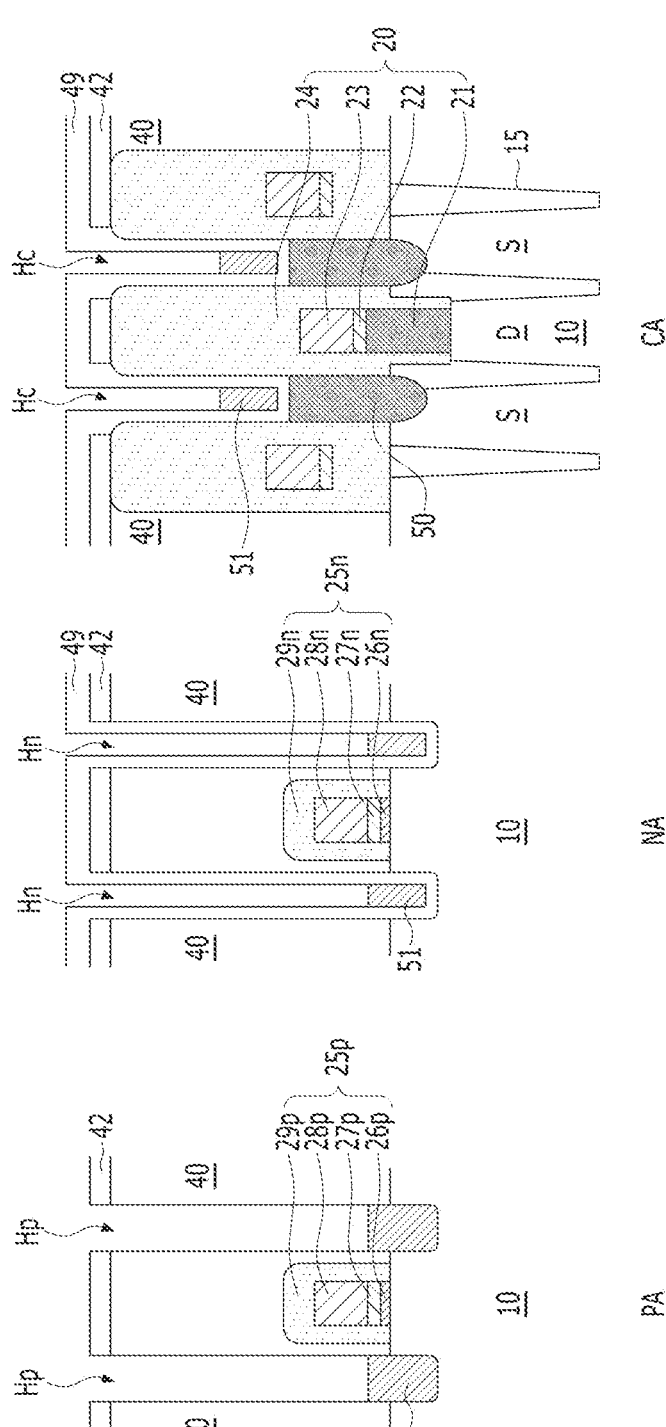

Referring to FIG. 5E, the method may further include forming a first metal layer 51 in the bottom portions of the holes Hp, Hn and Hc. The surface of the substrate 10 may be covered by the first metal layer 51 in the bottom portions of the first hole Hp. The first metal layer 51 may have a thickness or amount that is sufficient not to expose the surface of the substrate 10 in the first hole Hp. The first metal layer 51 may include cobalt (Co), molybdenum (Mo), or titanium carbon (TIC). Forming the first metal layer 51 may include repeating deposition processes and etching processes.

Figure 5F:
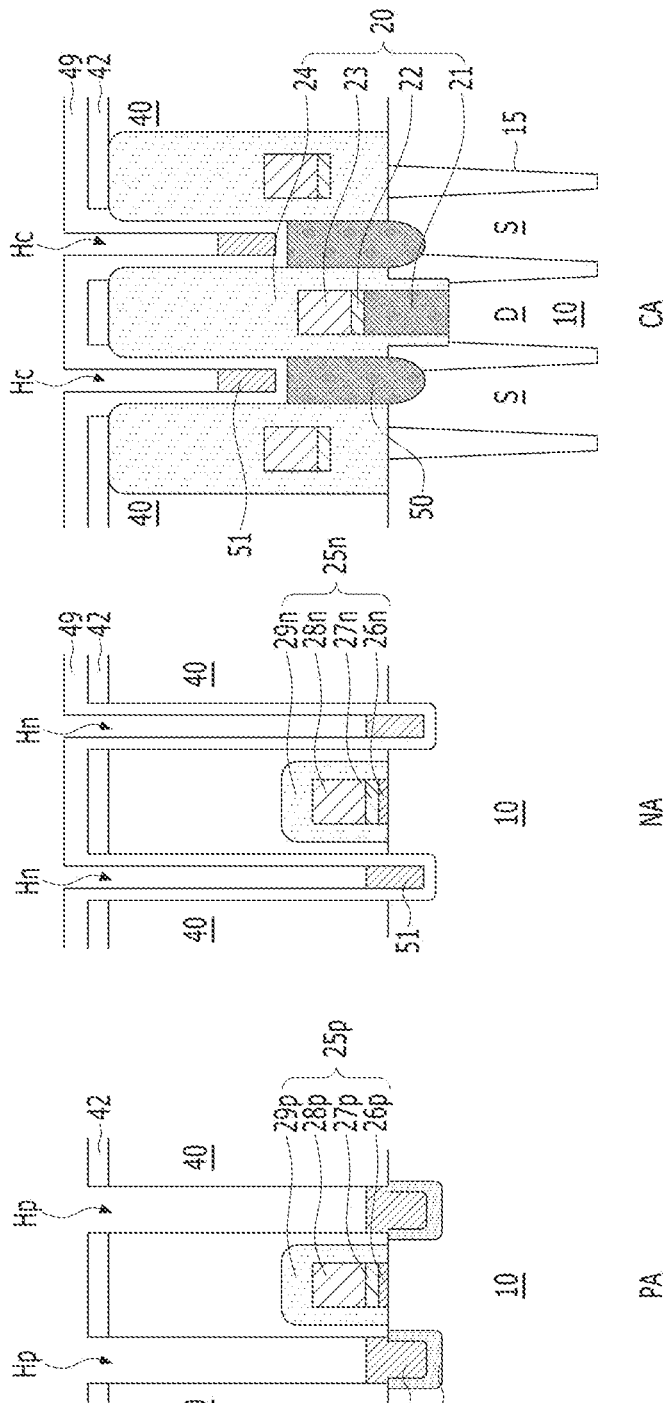

Referring to FIG. 5F, the method may further include forming a first metal silicide layer 51p over the substrate 10 in the bottom portions of the first holes Hp of the first transistor area PA. Forming the first metal silicide layer 51p may include reacting the first metal layer 51 with the substrate 10 by performing a first silicidation process. The first metal silicide layer 51p may be formed within a first temperature range. The first temperature range may be approximately from 650° C. to 850° C. The entire substrate 10 exposed on the sidewalls of the bottom portion of the first hole Hp may be silicidated. The substrate 10 may be rendered unexposed in the bottom portion of the first hole Hp. In the first silicidation process, since the first metal layer 51 in the second hole Hn of the second transistor area NA and the first metal layer 51 in the cell hole Hc of the cell area CA may be blocked by the sacrificial buffer dielectric layer 49 from contacting the lower cell contact plug 50 and the substrate 10, they may remain unsilicidated. That is, the first metal layer 51 in the second hole Hn of the second transistor area NA and the cell hole Hc of the cell area CA may be prevented from participating in the silicidation reaction.

Figure 5G:
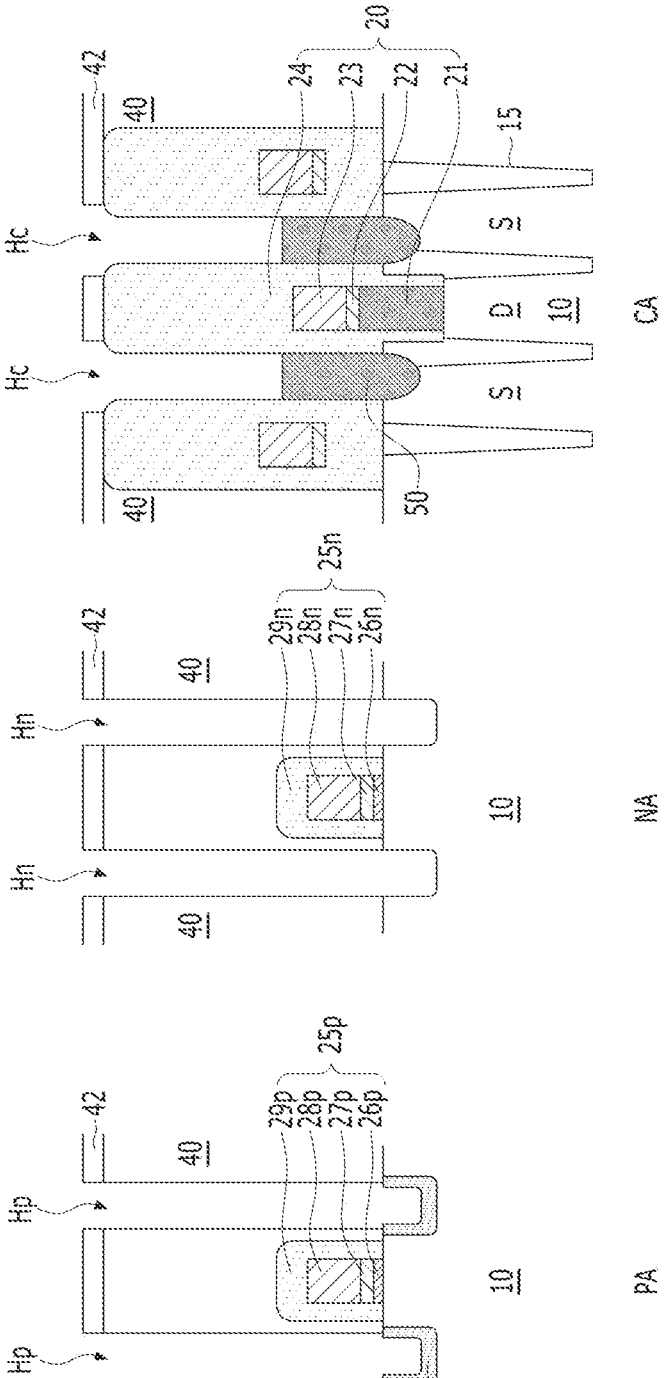

Referring to FIG. 5G, the method may further include removing the remaining first metal layer 51 and the remaining sacrificial buffer dielectric layer 49. The substrate 10 may be exposed at the bottom portion of the second hole Hn of the second transistor area NA, and the lower cell contact plug 50 may be exposed at the bottom portion of the cell hole Hc of the cell area CA.

Figure 5H:
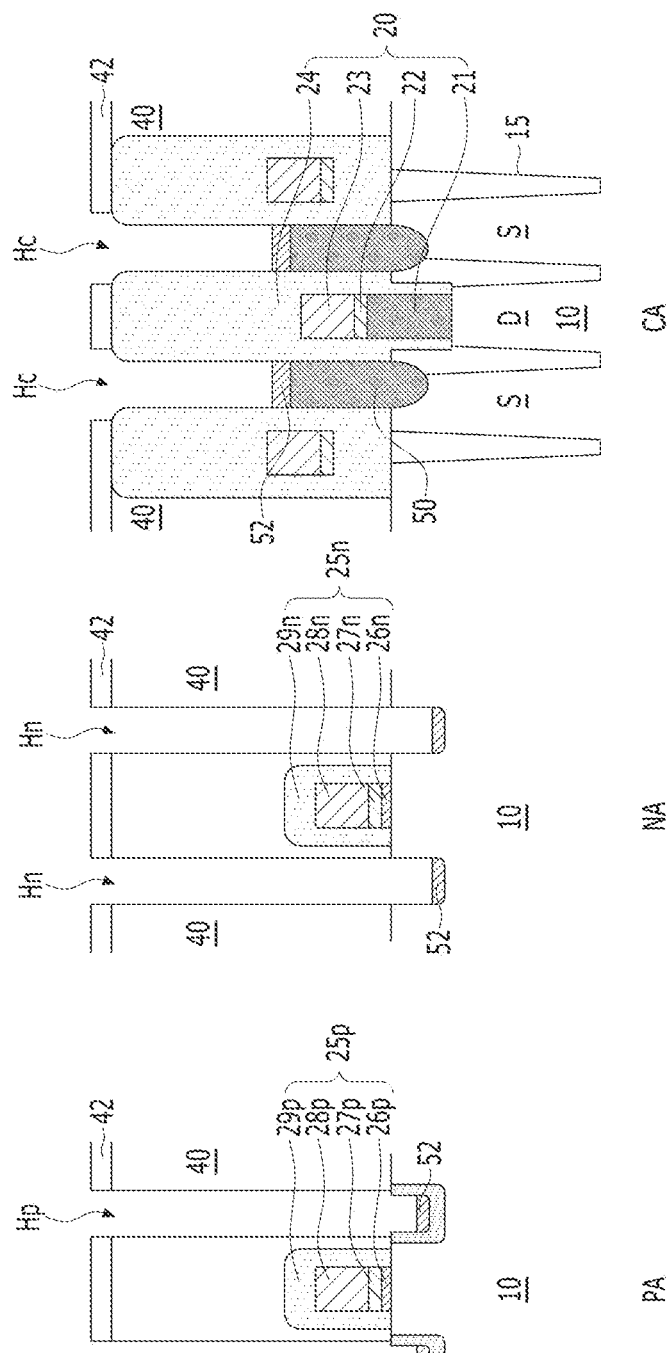

Referring to FIG. 5H, the method may further include forming a second metal layer 52 in the holes Hp, Hn and Hc. In an embodiment, the second metal layer 52 may be formed over the first metal silicide layer 51p in the first hole Hp of the first transistor area PA, on the surface of the substrate 10 in the bottom portions in the second hole Hn of the second transistor area NA, and over the lower cell contact plug 50 in the cell hole Hc of the cell area CA. Forming the second metal layer 52 may include repeating deposition processes and etching processes. The second metal layer 52 may be formed to be relatively thinner in terms of thickness or smaller in terms of amount than the first metal layer 51 so that the substrate 10 is exposed on the sidewalls of the bottom portions of the second hole Hn. The second metal layer 52 may include titanium (Ti) or niobium (Nb).

Figure 5I:
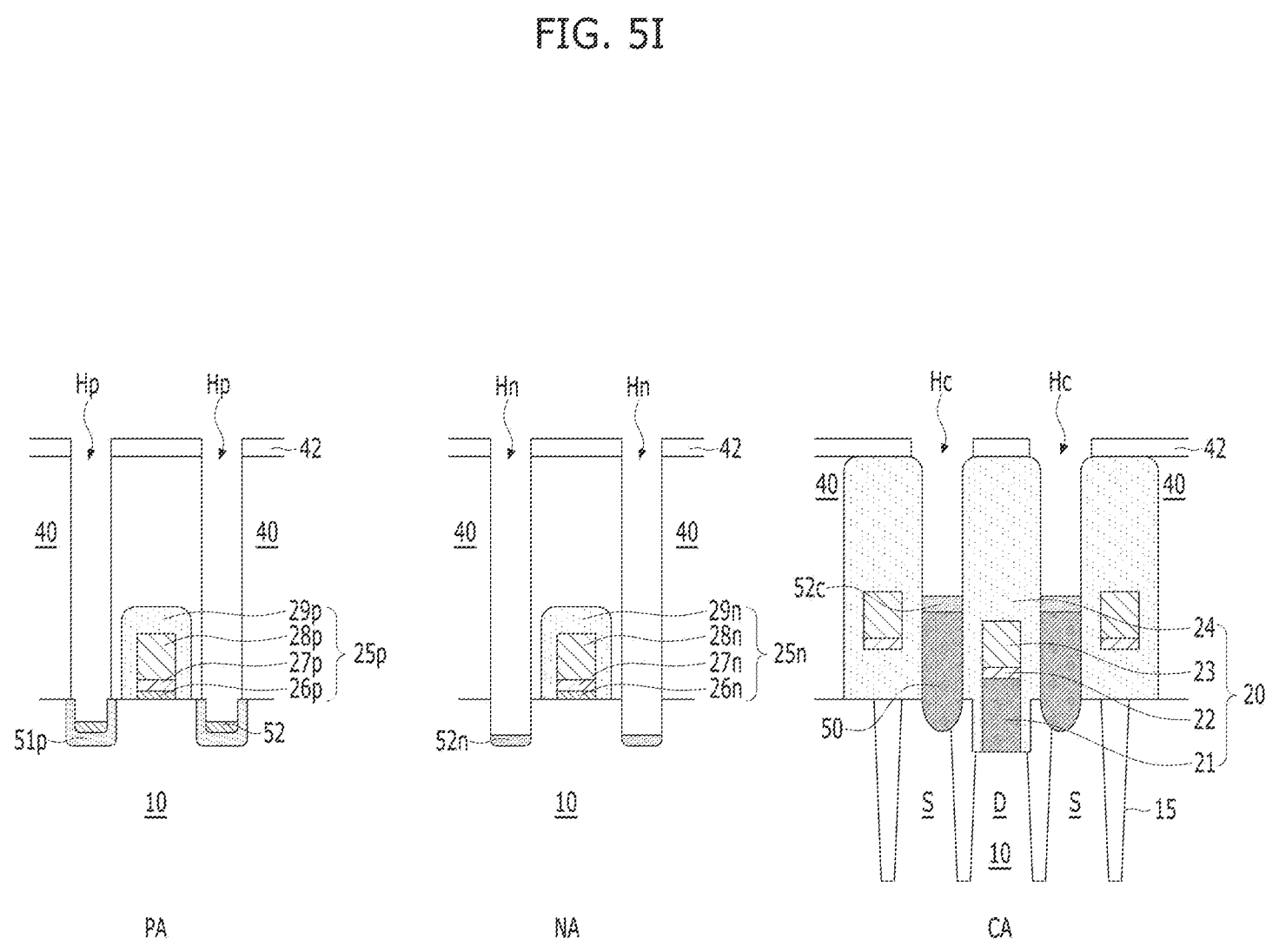

Referring to FIG. 5I, the method may include forming a second metal silicide layer 52n over the substrate 10 of the bottom portions of the second hole Hn of the second transistor area NA, and forming a cell contact silicide layer 52c over the lower cell contact plug 50 in the cell hole Hc of the cell area CA. Forming the second metal silicide layer 52n may include reacting the second metal layer 52 with the substrate 10 by performing a second silicidation process. The second metal silicide layer 52n may be formed within a second temperature range. The second temperature range may be lower than the first temperature range. The second temperature range may be approximately from 450° C. to 650° C. Since the temperature of the first silicidation process is higher than that of the second silicidation process, the vertical thickness, the horizontal width, or the volume of the first metal silicide layer 51p may be smaller than the vertical thickness, the horizontal width, or the volume of the second metal silicide layer 52n. In bottom portions of the first hole Hp of the first transistor area PA, the second metal layer 52 may be kept apart from the substrate 10 due to the presence of the first metal silicide layer 51p. Accordingly, the second metal layer 52 may remain without being silicidated in the bottom portions of the first hole Hp of the first transistor area PA. According to an embodiment of the present disclosure, the second metal layer 52 may remain over the first metal silicide layer 51p in the second hole Hn of the second transistor area NA and the cell hole Hc of the cell area CA.

Figure 5J:
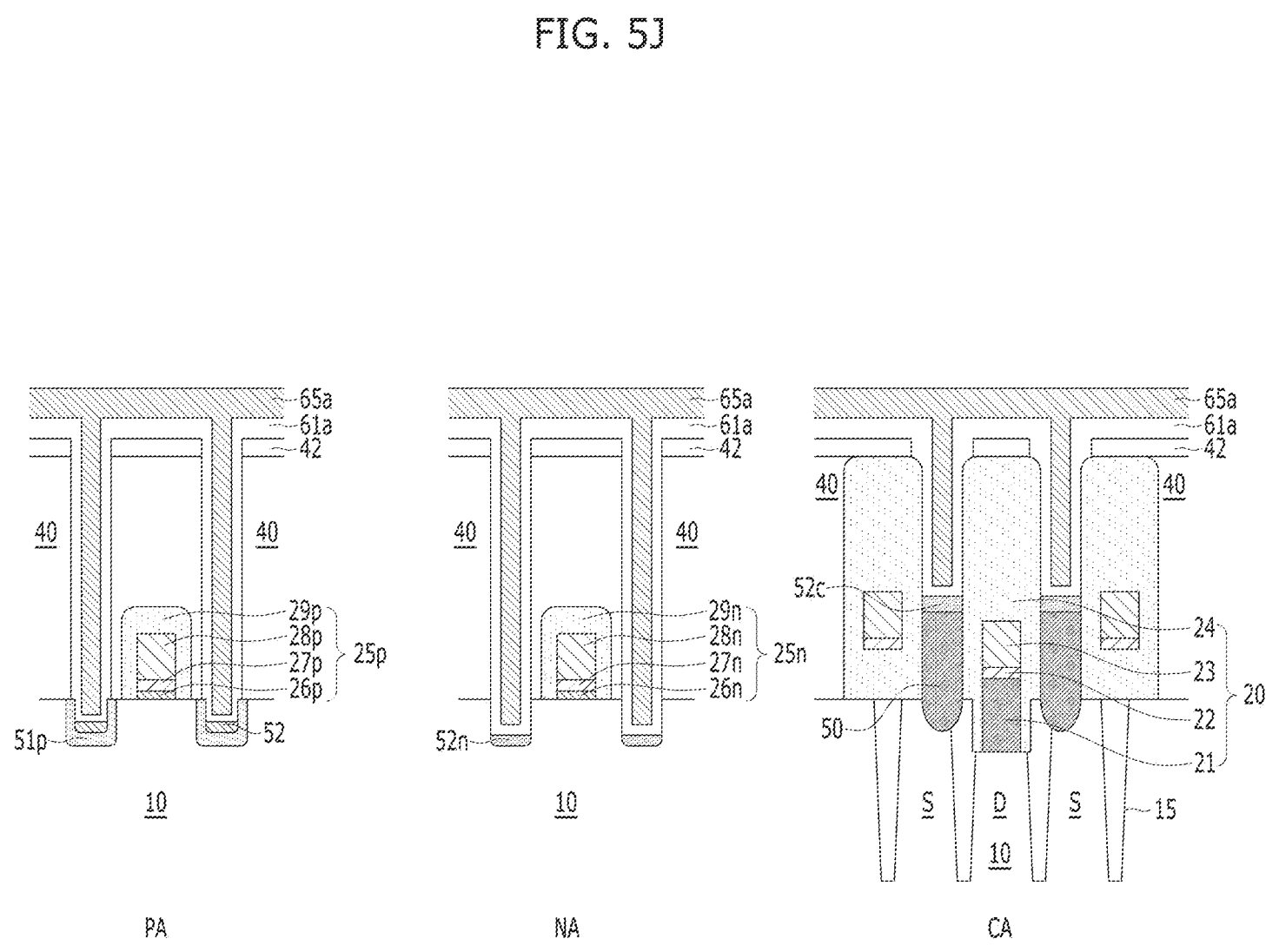

Referring to FIG. 5J, the method may further include conformally forming a barrier metal material layer 61a in the holes Hc, Hp, and Hn, and forming a plug metal material layer 65a to fill the holes Hp, Hn, and Hc. The barrier metal material layer 61a and the plug metal material layer 65a may also be formed over the stopping layer 42.

Figure 5K:
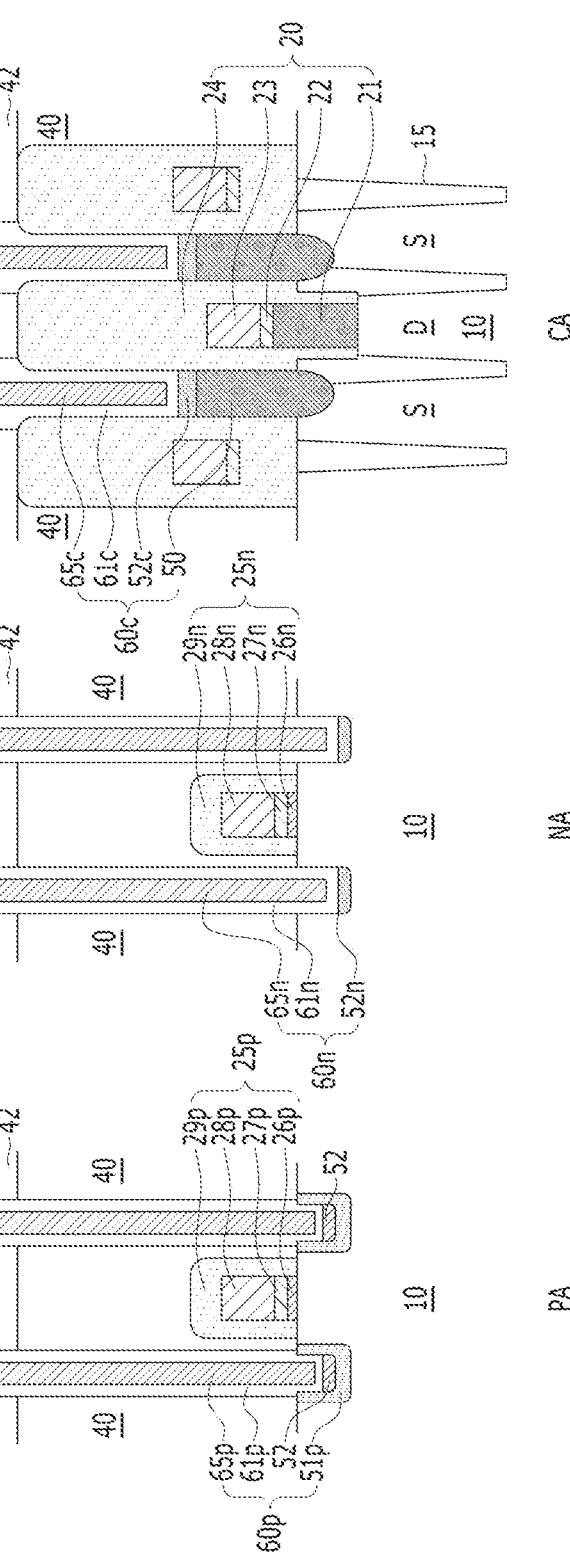

Referring to FIG. 5K, the method may include forming a first contact plug structure 60p, a second contact plug structure 60n, and a cell contact plug structure 60c by removing the plug metal material layer 65a and the barrier metal material layer 61a over the stopping layer 42 by a planarization process, such as a chemical mechanical polishing (CMP) process. The first contact plug structure 60p may include a first metal silicide layer 51p, a second metal layer 52, a first contact barrier layer 61p, and a first contact plug 65p, and the second contact plug structure 60n may include a second metal silicide layer 52n, a second contact barrier layer 61n, and a second contact plug 65n, and the cell contact plug structure 60c may include a lower cell contact plug 50, a cell contact silicide layer 52c, a cell contact barrier layer 61c, and an upper cell contact plug 65c.

Subsequently, referring back to FIG. 2A, the method may further include the following operations: forming an upper inter-layer dielectric layer 46 over the first contact plug structure 60p, the second contact plug structure 60n, and the cell contact plug structure 60c; forming a first metal via plug 73p, a second metal via plug 73n, and a capacitor structure 71 that penetrate the upper inter-layer dielectric layer 46; and forming the first metal wire 74p, the second metal wire 74n, and the cell metal wire 72 over the first metal via plug 73p, the second metal via plug 73n, and the capacitor structure 71. The operation of forming the upper inter-layer dielectric layer 46 may include forming a dielectric material, such as silicon oxide ($SiO_2$) by performing a deposition process. Moreover, the operation of forming the first metal via plug 73p and the second metal via plug 73n may include forming holes that penetrate the upper inter-layer dielectric layer 46, and forming dielectric liner layers, barrier metal layers, and plug metal materials in the holes. The operation of forming the capacitor structure 71 may include forming a lower capacitor electrode 71a, a capacitor dielectric layer 71b, and an upper capacitor electrode 71c by performing a storage forming process. Additionally, the operation of forming the first metal wire 74p, the second metal wire 74n, and the cell metal wire 72 may include performing a deposition process, a photolithography process, and an etching process.

Figure 6:
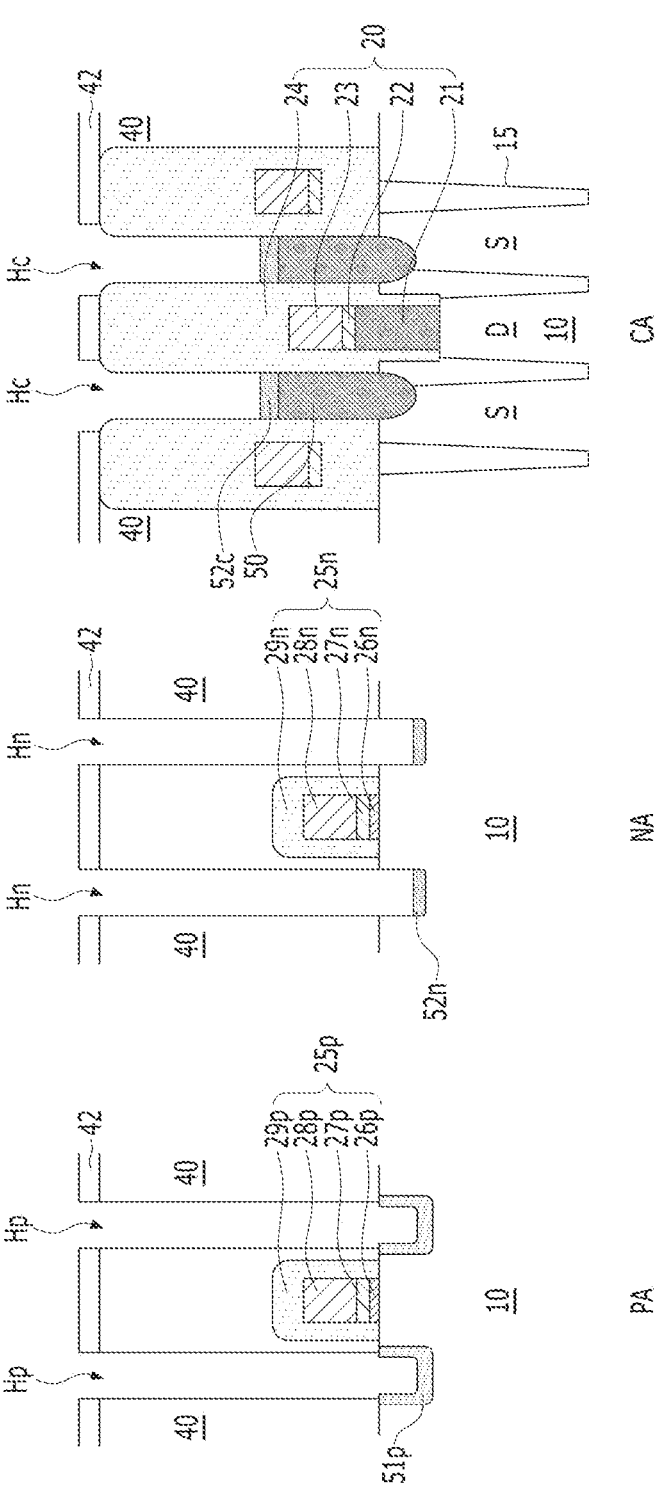

FIG. 6 is a longitudinal cross-sectional view taken along lines I-I', II-II', and III-III' shown in FIG. 1 to describe a method for fabricating a semiconductor device in accordance with an embodiment of the present disclosure. Referring to FIG. 6, the method for fabricating a semiconductor device in accordance with the embodiment of the present disclosure may further include: performing the processes that are described with reference to FIGS. 5A to 5I, and removing the second metal layer 52 that remains over the first metal silicide layer 51p. Subsequently, the method may further include fabricating the semiconductor device described with reference to FIG. 2B by performing the processes that are described with reference to FIGS. 5J to 5K and FIG. 2A.

Figure 7A:
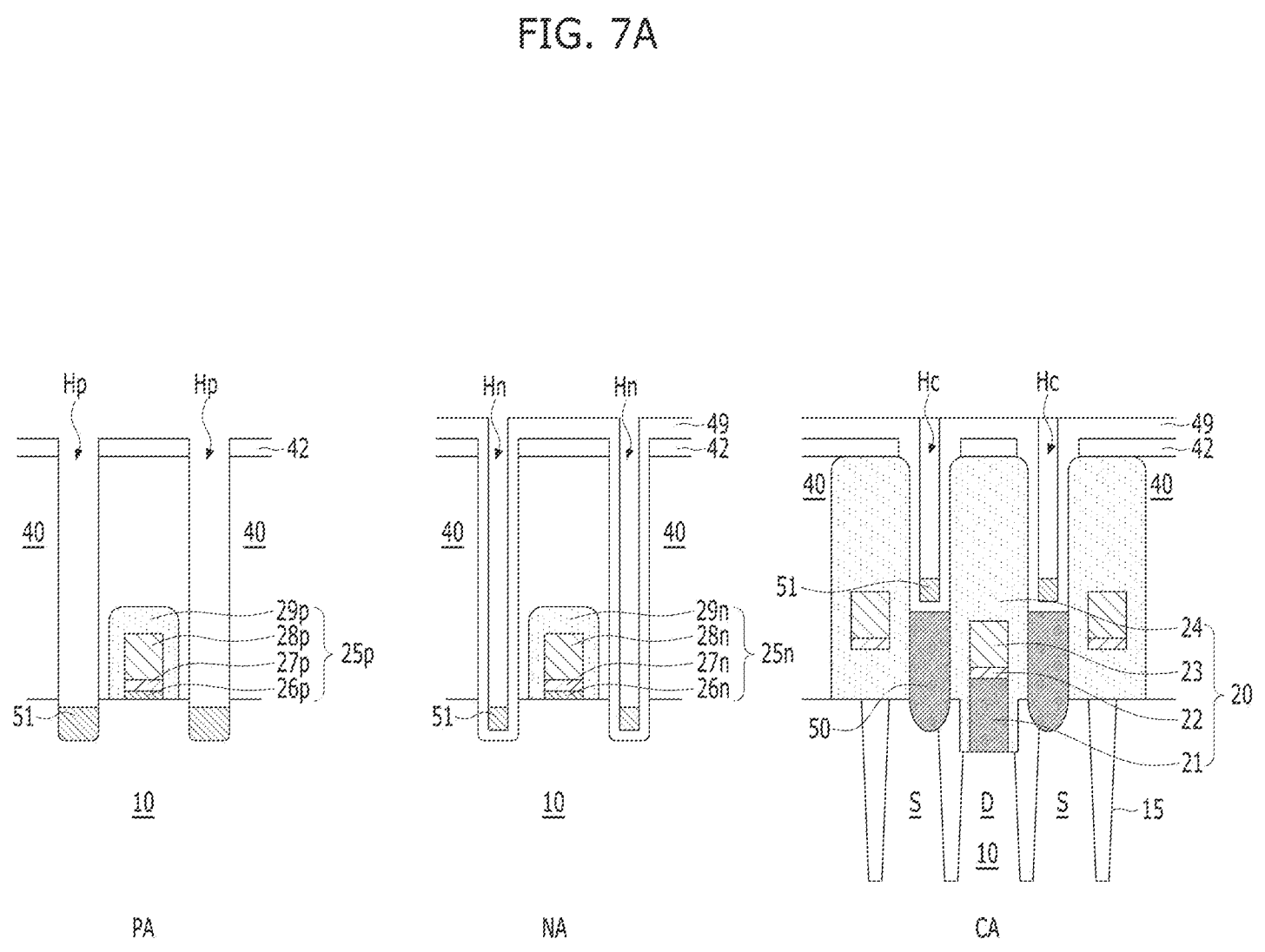
Figure 7B:
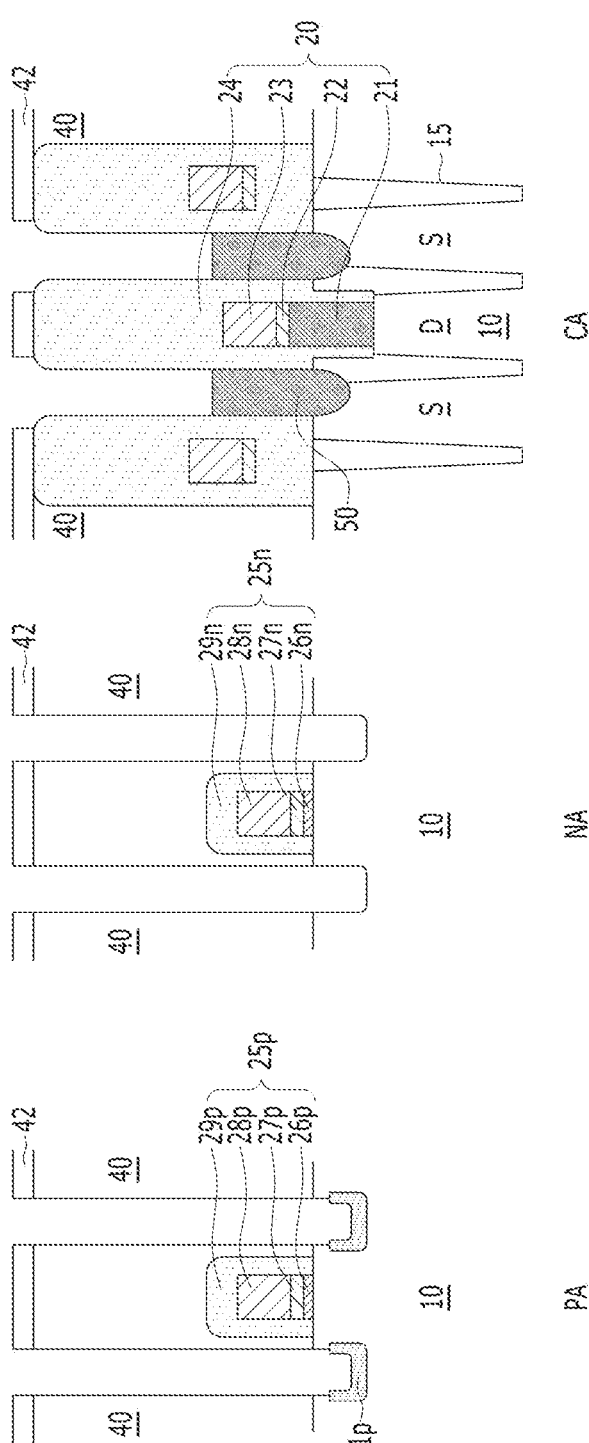
Figure 7C:
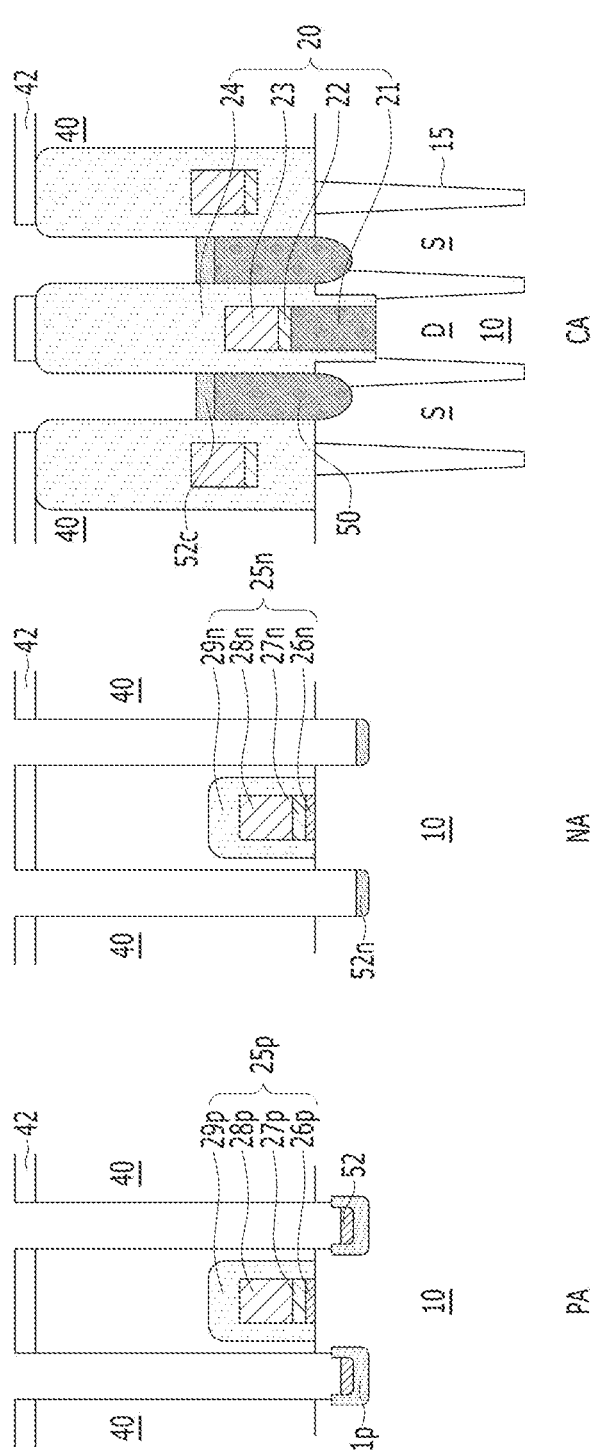

FIGS. 7A to 7C are longitudinal cross-sectional views taken along lines I-I', II-II', and III-III' shown in FIG. 1 to describe a method for fabricating a semiconductor device in accordance with an embodiment of the present disclosure. Referring to FIG. 7A, the method for fabricating a semiconductor device in accordance with an embodiment of the present disclosure may further include forming a first metal layer 51 in the bottom portions of the holes Hp, Hn and Hc by performing the processes that are described with reference to FIGS. 5A to 5D and performing the process that is described with reference to FIG. 5E. The surface of the first metal layer 51 may be lower than the surface of the substrate 10. Namely, the substrate 10 may be exposed on the sidewalls of the bottom portions of the first hole Hp.

Referring to FIG. 7B, the method may further include forming a first metal silicide layer 51p by performing the processes described with reference to FIGS. 5F and 5G, and removing the first metal layer 51 and the sacrificial buffer dielectric layer 49. The substrate 10 may be exposed on the sidewalls of the bottom portions of the first hole Hp in the first transistor area PA.

Referring to FIG. 7C, the method may further include forming a second metal layer 52 in the holes Hp, Hn and Hc by performing the process described with reference to FIG. 5H. The second metal layer 52 may be formed to be relatively thinner in terms of the thickness or smaller in terms of the amount than the first metal layer 51, so that the substrate 10 is exposed on the sidewalls of the bottom portions of the second hole Hn. In bottom portions of the first hole Hp in the first transistor area PA, the second metal layer 52 may be kept apart from the substrate 10 by being surrounded by the first metal silicide layer 51p. Subsequently, the method may further include performing the processes described with reference to FIGS. 5I to 5K and FIG. 2A, and fabricating the semiconductor device that is described with reference to FIG. 2C.

Figure 8:
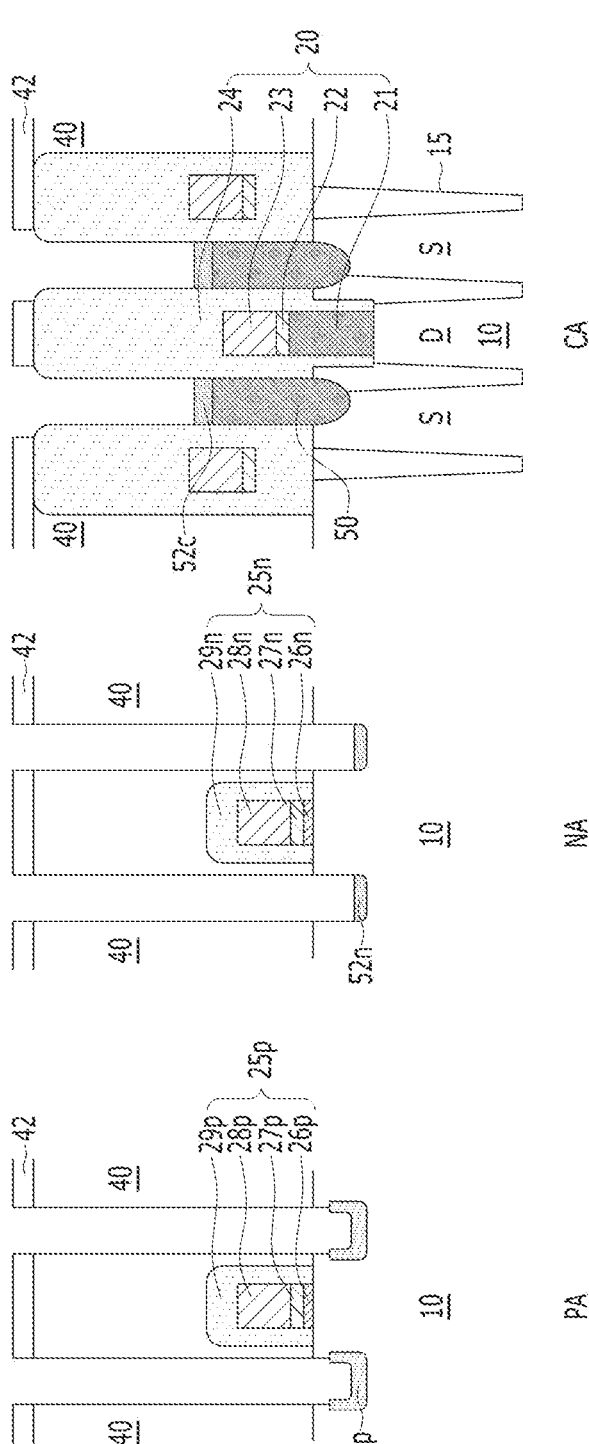

FIG. 8 is a longitudinal cross-sectional view taken along lines I-I', II-II', and III-III' shown in FIG. 1 to describe a method for fabricating a semiconductor device in accordance with an embodiment of the present disclosure. Referring to FIG. 8, the method for fabricating a semiconductor device in accordance with an embodiment of the present disclosure may further include performing the processes that are described with reference to FIGS. 5A to 5D and 7A to 7C, and removing the remaining second metal layer 52. Subsequently, the method may further include fabricating the semiconductor device that is described with reference to FIG. 2D by performing the processes that are described with reference to FIGS. 5I to 5K and FIG. 2A.

According to an embodiment of the present disclosure, since the metal silicide of the PMOS region and the metal silicide of the NMOS region include different metal silicides, the PMOS metal silicide and the NMOS metal silicide may be optimized individually.

According to an embodiment of the present disclosure, since the metal silicide of the PMOS region and the metal silicide of the NMOS region are formed by different silicidation processes, interference between the metal silicides may be minimized.

While the present invention has been described with respect to the specific embodiments, it will be apparent to those skilled in the art that diverse changes and modifications may be made without departing from the spirit and scope of the invention as defined in the following claims. Furthermore, the embodiments may be combined to form additional embodiments.

What is claimed is:

1. A semiconductor device comprising:
an inter-layer dielectric layer disposed over a substrate;
a first contact plug structure coupled to a first active region of the substrate by vertically penetrating the inter-layer dielectric layer; and
a second contact plug structure coupled to a second active region of the substrate by vertically penetrating the inter-layer dielectric layer,
wherein the first contact plug structure includes:
a first metal silicide layer;
a first contact barrier layer disposed over the first metal silicide layer; and
a first contact plug disposed over the first contact barrier layer,
wherein the second contact plug structure includes:
a second metal silicide layer;

a second contact barrier layer disposed over the second metal silicide layer; and
a second contact plug disposed over the second contact barrier layer,
wherein the first metal silicide layer and the second metal silicide layer include different metal silicides,
wherein the first metal silicide layer has a U-shaped cross-section to be in contact with outer side surfaces of a lower portion of the first contact barrier layer,
wherein outer side surfaces of the first metal silicide layer are in contact with the substrate,
wherein the second metal silicide layer has a pad shape in contact with a bottom surface of the second contact barrier layer, and
wherein outer side surfaces of the second contact barrier layer are not surrounded by the second metal silicide layer.

2. The semiconductor device of claim 1,
wherein the first metal silicide layer includes at least one of cobalt silicide, molybdenum silicide, and titanium carbon silicide, and
wherein the second metal silicide layer includes either titanium silicide or niobium silicide.

3. The semiconductor device of claim 1, further comprising a metal layer disposed between the first metal silicide layer and the first contact barrier layer,
wherein the metal layer and the second metal silicide layer contain a same metal.

4. The semiconductor device of claim 3, wherein the first metal silicide layer is in contact with bottom and side surfaces of the metal layer.

5. The semiconductor device of claim 1, further comprising a third contact plug structure coupled to a third region of the substrate,
wherein the third contact plug structure includes:
a lower contact plug between bit line structures and coupled to a source region of the substrate;
a third metal silicide layer disposed over the lower contact plug;
a third contact barrier layer disposed over the third metal silicide layer;
a third contact plug disposed over the third metal silicide layer; and
a capacitor structure disposed over the third contact plug, and
wherein the third metal silicide layer includes a same metal silicide as the second metal silicide layer.

6. The semiconductor device of claim 1, wherein side surfaces of a lower portion of the second contact barrier layer are in contact with the substrate.

7. A semiconductor device comprising:
a first contact plug structure disposed in a first region of a substrate;
a second contact plug structure disposed in a second region of the substrate; and
a cell contact plug structure between bit line structures disposed in a cell region of the substrate,
wherein the first contact plug structure includes a first metal silicide layer, a first contact barrier layer, and a first contact plug, which are sequentially stacked,
wherein the second contact plug structure includes a second metal silicide layer, a second contact barrier layer, and a second contact plug, which are sequentially stacked,
wherein the cell contact plug structure includes a lower contact plug coupled to the cell region of the substrate, a cell metal silicide layer, a cell contact barrier layer, a cell contact plug, and a capacitor structure, which are sequentially stacked, wherein the first metal silicide layer and the second metal silicide layer include different metals, wherein the second metal silicide layer and the cell metal silicide layer include a same metal, wherein the cell contact silicide layer is disposed at a higher level than the first and second metal silicide layers.

8. The semiconductor device of claim 7, further comprising a metal layer disposed between the first metal silicide layer and the first contact barrier layer, wherein the metal layer, the second metal silicide layer, and the cell metal silicide layer contain the same metal, wherein the first metal silicide layer is in contact with outer side surfaces of a lower portion of the first contact barrier layer, wherein outer side surfaces of the first metal silicide layer are in contact with the substrate, wherein the second metal silicide layer has a pad shape in contact with a bottom surface of the second contact barrier layer, and wherein side surfaces of the second contact barrier layer are not surrounded by the second metal silicide layer.

9. The semiconductor device of claim 8, wherein bottom and side surfaces of the metal layer are in contact with the first metal silicide layer, and wherein a top surface of the metal layer is in contact with the first contact barrier layer.

10. The semiconductor device of claim 7, wherein the first metal silicide layer has a horizontal withed wider than the second metal silicide layer and a vertical height greater than the second metal silicide layer.

11. The semiconductor device of claim 1, wherein the substrate includes:

a first epitaxial grown region in the first active region in which the first metal silicide layer is disposed; and a second epitaxial grown region in the second active region in which the second metal silicide layer is disposed.

12. A semiconductor device comprising:

a substrate with a first transistor area and a second transistor area;

a first gate structure and a first contact plug structure in the first transistor area; and a second gate structure and a second contact plug structure in the second transistor area, wherein the first contact plug structure includes:

a first metal silicide layer in the substrate;

a first contact barrier layer over the first metal silicide layer; and a first contact plug over the first contact barrier layer, wherein the second contact plug structure includes:

a second metal silicide layer in the substrate;

a second contact barrier layer over the second metal silicide layer; and a second contact plug over the second contact barrier layer, wherein:

the first metal silicide layer surrounds a bottom and side surfaces of a lower portion of the first contact barrier layer, outer side surfaces of the first metal silicide layer are in contact with the substrate, the second metal silicide layer is in contact with a bottom of the second contact barrier layer, and outer side surfaces of a lower portion of the second contact barrier layer are in contact with the substrate.

13. The semiconductor device of claim 12, further comprising:

a metal layer between the first metal silicide layer and the first contact barrier layer, wherein:

the metal layer does not surround the contact barrier layer, side surfaces of the metal layer are in contact with and surrounded by the first metal silicide layer, and the bottom of the first contact barrier layer is in contact with the metal layer.

14. The semiconductor device of claim 12, wherein a top end of the first metal silicide layer is higher than a top portion of the second metal silicide layer.

15. The semiconductor device of claim 14, wherein the top portion of the second metal silicide layer is lower than and spaced apart from a surface of the substrate.

16. The semiconductor device of claim 12, wherein the substrate includes:

a first epitaxial grown region in the first transistor area in which the first metal silicide layer is disposed; and a second epitaxial grown region in the second transistor area in which the second metal silicide layer is disposed.

17. The semiconductor device of claim 12, further comprising:

a cell structure in a cell area of the substrate, wherein the cell structure includes:

a source region and a drain region;

a bit line structure including a bit line contact plug coupled to the drain region;

a lower contact plug coupled to the source region, a cell contact silicide layer over the lower contact plug;

a cell contact barrier layer over the cell contact silicide layer;

a cell contact plug over the cell contact barrier layer; and a capacitor structure over the cell contact plug structure.

18. The semiconductor device of claim 17, wherein the cell contact silicide layer is positioned at a higher level than the first and second metal silicide layers.

19. The semiconductor device of claim 18, wherein the second contact silicide layer and the cell contact silicide layer include a same metal.

20. The semiconductor device of claim 12, wherein a top end of the first metal silicide layer is lower than the first gate dielectric layer.

* * * * *